(12) United States Patent
Osaka et al.

(10) Patent No.: US 10,649,174 B2
(45) Date of Patent: May 12, 2020

(54) LENS DRIVING DEVICE, CAMERA MODULE, AND CAMERA-MOUNTED DEVICE

(71) Applicants: Tomohiko Osaka, Tokyo (JP); Atsushi Kikuchi, Tokyo (JP)

(72) Inventors: Tomohiko Osaka, Tokyo (JP); Atsushi Kikuchi, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 29 days.

(21) Appl. No.: 16/011,667

(22) Filed: Jun. 19, 2018

(65) Prior Publication Data
US 2018/0364445 A1    Dec. 20, 2018

(30) Foreign Application Priority Data

Jun. 19, 2017   (JP) .................................. 2017-119947

(51) Int. Cl.
*G02B 7/09*         (2006.01)
*H04N 5/232*        (2006.01)
(Continued)

(52) U.S. Cl.
CPC .................. *G02B 7/09* (2013.01); *G03B 3/10* (2013.01); *G03B 5/02* (2013.01); *G03B 17/561* (2013.01);
(Continued)

(58) Field of Classification Search
CPC .......... G02B 7/09; G02B 7/04; G03B 17/561; G03B 2205/0069; G03B 2205/0015; G03B 3/10; G03B 5/02; G03B 5/00; G03B 13/36; H04N 5/2328; H04N 5/369; H04N 5/2253; H04N 5/23287; H04N 5/2254; H04N 5/2257; H01L 43/06
See application file for complete search history.

(56) References Cited

U.S. PATENT DOCUMENTS

| | | | |
|---|---|---|---|
| 2013/0016428 A1* | 1/2013 | Sugawara | G02B 7/08 359/557 |
| 2014/0177056 A1* | 6/2014 | Hayashi | G02B 7/08 359/557 |

(Continued)

FOREIGN PATENT DOCUMENTS

| | | |
|---|---|---|
| JP | 2012-177753 A | 9/2012 |
| JP | 2013-210550 A | 10/2013 |

*Primary Examiner* — Timothy J Henn
(74) *Attorney, Agent, or Firm* — Brundidge & Stanger, P.C.

(57) ABSTRACT

Provided are a lens driving device, a camera module, and a camera-mounted device for which the miniaturization and weight reduction can be achieved and the reliability can also be improved. The lens driving device includes auto-focusing and shake-correcting driving parts utilizing a voice coil motor. A shake-correcting fixing part includes a coil board consisting of a multilayer printed wiring board in which multiple unit layers consisting of a conductor layer and an insulating layer are stacked on one another, and a base on which the coil board is placed. A shake-correcting coil part, an external terminal, and a conductor pattern including a power-supply line configured to connect the external terminal to the shake-correcting coil part are integrally formed in the coil board.

15 Claims, 21 Drawing Sheets

(51) Int. Cl.
  *G03B 17/56* (2006.01)
  *H04N 5/369* (2011.01)
  *H01L 43/06* (2006.01)
  *H04N 5/225* (2006.01)
  *G03B 3/10* (2006.01)
  *G03B 5/02* (2006.01)

(52) U.S. Cl.
  CPC ........... *H01L 43/06* (2013.01); *H04N 5/2253* (2013.01); *H04N 5/2254* (2013.01); *H04N 5/2257* (2013.01); *H04N 5/2328* (2013.01); *H04N 5/23287* (2013.01); *H04N 5/369* (2013.01); *G03B 2205/0015* (2013.01); *G03B 2205/0069* (2013.01)

(56) References Cited

U.S. PATENT DOCUMENTS

| | | | |
|---|---|---|---|
| 2014/0255016 A1* | 9/2014 | Kim | G02B 27/646 396/55 |
| 2015/0146025 A1* | 5/2015 | Bang | G02B 7/08 348/208.99 |
| 2015/0253583 A1* | 9/2015 | Cho | G02B 13/0015 348/360 |
| 2016/0238856 A1* | 8/2016 | Sul | G02B 7/08 |
| 2017/0155816 A1* | 6/2017 | Ito | H04N 5/2328 |
| 2018/0172944 A1* | 6/2018 | Matsuhisa | G03B 5/00 |
| 2018/0196218 A1* | 7/2018 | Kao | G02B 7/06 |
| 2018/0246341 A1* | 8/2018 | Jung | G02B 7/08 |
| 2019/0204532 A1* | 7/2019 | Konuma | G02B 7/02 |

* cited by examiner

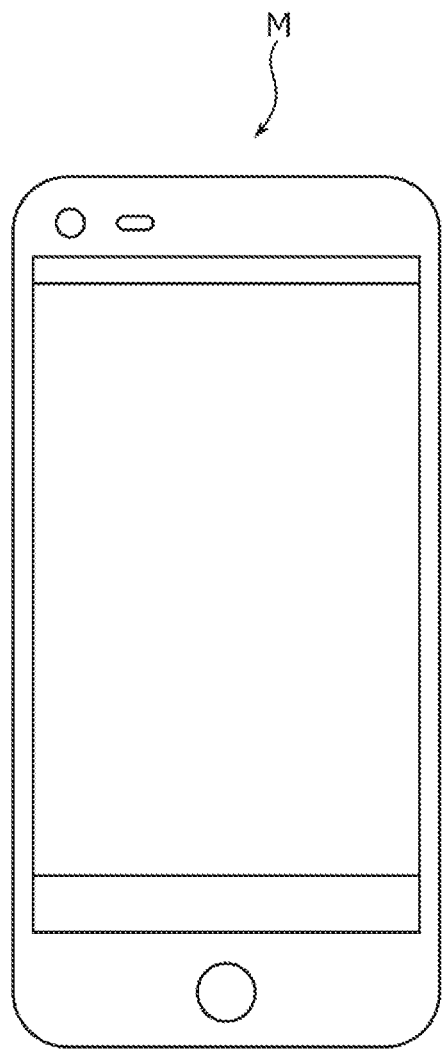
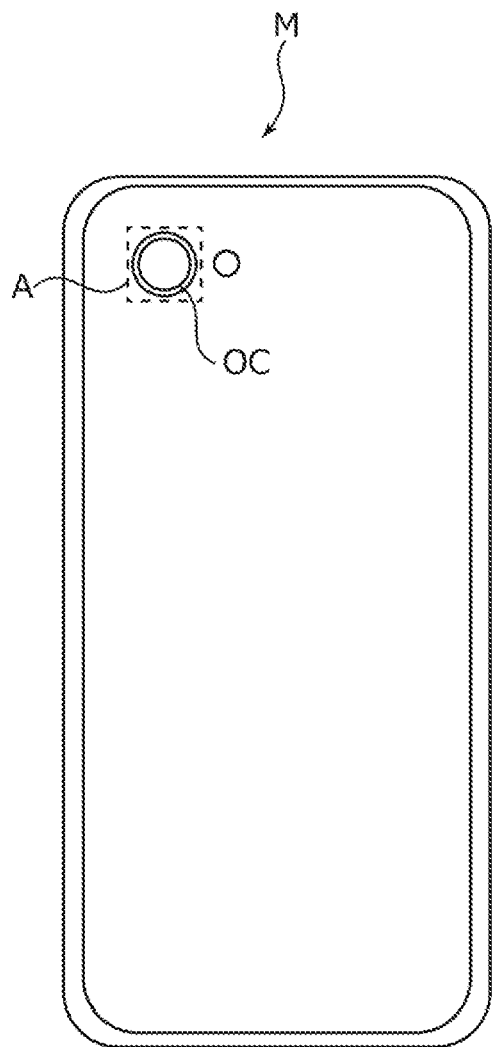
FIG. 1A
FIG. 1B

LENS DRIVING DEVICE, CAMERA MODULE, AND CAMERA-MOUNTED DEVICE

CROSS REFERENCE TO RELATED APPLICATIONS

This application is entitled to and claims the benefit of Japanese Patent Application No. 2017-119947, filed on Jun. 19, 2017, the disclosure of which including the specification, drawings and abstract is incorporated herein by reference in its entirety.

TECHNICAL FIELD

The present invention relates to a lens driving device for auto-focusing and shake-correcting, a camera module, and a camera-mounted device.

BACKGROUND ART

In general, a small-sized camera module is mounted in mobile terminals, such as smartphones. A lens driving device having an autofocus function of automatically performing focusing during capturing of a subject (hereinafter referred to as "AF (Auto Focus) function") and a shake-correcting function (hereinafter referred to as "OIS (Optical Image Stabilization) function") for reducing irregularities of an image by correcting shake (vibration) caused during capturing of an image is applied in such a camera module (see e.g. Patent Literatures (hereinafter referred to as "PTLs") 1 and 2).

The lens driving device including the autofocus and shake-correcting functions is provided with an auto-focusing driving part for moving a lens part in the optical-axis direction (hereinafter, the auto-focusing driving part is referred to as "AF driving part") and a shake-correcting driving part for swaying the lens part in a plane orthogonal to the optical-axis direction (hereinafter, the shake-correcting driving part is referred to as "OIS driving part"). In PTLs 1 and 2, a voice coil motor (VCM) is employed in the AF driving part and the OIS driving part.

The AF driving part of a VCM-driven system includes, for example, an auto-focusing coil part (hereinafter referred to as "AF coil part") disposed at the periphery of the lens part, and an auto-focusing magnet part (hereinafter referred to as "AF magnet part") disposed to be radially spaced apart from the AF coil part. An autofocus movable part (hereinafter referred to as "AF movable part") including the lens part and the AF coil part is supported by an auto-focusing supporting part (hereinafter referred to as "AF supporting part" (e.g. plate spring)) such that the AF movable part is radially spaced apart from an autofocus fixing part (hereinafter referred to as "AF fixing part") including the AF magnet part. Focusing is automatically carried out by moving the AF movable part in the optical-axis direction by utilizing a driving force of the voice coil motor composed of the AF coil part and the AF magnet part.

The OIS driving part of the VCM-driven system includes, for example, a shake-correcting magnet part (hereinafter referred to as "OIS magnet part") disposed in the AF driving part and a shake-correcting coil part (hereinafter referred to as "OIS coil part") disposed to be spaced apart from the OIS magnet part in the optical-axis direction. A shake-correcting movable part (hereinafter referred to as "OIS movable part") including the AF driving part and the OIS magnet part is supported by shake-correcting supporting parts (hereinafter referred to as "OIS supporting parts" (e.g. suspension wires)) such that the shake-correcting movable part is spaced apart in the optical-axis direction from a shake-correcting fixing part (hereinafter referred to as "OIS fixing part") including the OIS coil part. Shake correction is performed by swaying the OIS movable part with respect to the OIS fixing part in the plane orthogonal to the optical-axis direction by utilizing the driving force of the voice coil motor composed of the OIS magnet part and the OIS coil part.

CITATION LIST

Patent Literature

PTL 1: Japanese Patent Application Laid-Open No. 2013-210550
PTL 2: Japanese Patent Application Laid-Open No. 2012-177753

SUMMARY OF INVENTION

Technical Problem

In recent years, there has been a demand for further miniaturization and further weight reduction of lens driving devices in order to achieve the miniaturization (thickness reduction) and/or weight reduction of camera-mounted devices, such as smartphones and the like.

An object of the present invention is to provide a lens driving device, a camera module, and a lens driving device for which the miniaturization and weight reduction can be achieved and the reliability can also be improved.

Solution to Problem

A lens driving device according to the present invention includes an auto-focusing driving part including: an auto-focusing coil part to be disposed at a periphery of a lens part; an auto-focusing magnet part to be disposed to be radially spaced apart from the auto-focusing coil part; and an auto-focusing supporting part configured to support an autofocus movable part to be movable in an optical-axis direction with respect to an autofocus fixing part, the autofocus movable part including the auto-focusing coil part, the autofocus fixing part including the auto-focusing magnet part, the auto-focusing driving part being configured to perform automatic focusing by utilizing a driving force of a voice coil motor composed of the auto-focusing coil part and the auto-focusing magnet part, and the lens driving device also includes a shake-correcting driving part including: a shake-correcting magnet part to be disposed in the auto-focusing driving part; a shake-correcting coil part to be disposed to be spaced apart from the shake-correcting magnet part in the optical-axis direction; and a shake-correcting supporting part configured to support a shake-correcting movable part to be able to sway in an optical-axis-orthogonal plane with respect to a shake-correcting fixing part, the shake-correcting movable part including the shake-correcting magnet part, the shake-correcting fixing part including the shake-correcting coil part, the shake-correcting driving part being configured to perform shake correction by utilizing a driving force of an another voice coil motor composed of the shake-correcting coil part and the shake-correcting magnet part. In the lens driving device, the shake-correcting fixing part includes a coil board consisting of a multilayer printed wiring board in which a plurality of unit layers consisting of a conductor layer and an insulating layer are stacked on one another, and a base on which the coil board is to be placed, and the shake-correcting coil part, an external terminal, and a conductor pattern including a power-supply line configured to connect the external terminal to the shake-correcting coil part are integrally formed in the coil board.

A camera module according to the present invention includes: the aforementioned lens driving device; a lens part to be mounted on the autofocus movable part; and an image capturing part configured to capture a subject image imaged by the lens part.

A camera-mounted device according to the present invention is a camera-mounted device that is an information device or a transporting device, and includes: the aforementioned camera module; and a control part configured to process image information obtained by the camera module.

Advantageous Effects of Invention

According to the present invention, it is possible to achieve the miniaturization and weight reduction of a lens driving device, a camera module, and a camera-mounted device and to improve the reliability of the lens driving device, camera module, and camera-mounted device.

BRIEF DESCRIPTION OF DRAWINGS

FIGS. 1A and 1B illustrate a smartphone in which a camera module according to an embodiment of the present invention is mounted;

DESCRIPTION OF EMBODIMENTS

Hereinafter, embodiments of the invention will be described in detail with reference to the accompanying drawings.

FIGS. 1A and 1B illustrate smartphone M (camera-mounted device) in which camera module A according to embodiments of the present invention is mounted. FIG. 1A is a front view of smartphone M and FIG. 1B is a rear view of smartphone M.

Smartphone M is provided with camera module A, for example, as back side camera OC. Camera module A has an AF function and an OIS function, and can capture an image without image blurring by automatically performing focusing at the time of capturing a subject and by optically correcting shake (vibration) caused at the time of capturing the image. Additionally, smartphone M includes a control part (not illustrated) configured to process image information obtained by camera module A.

Figure 2:
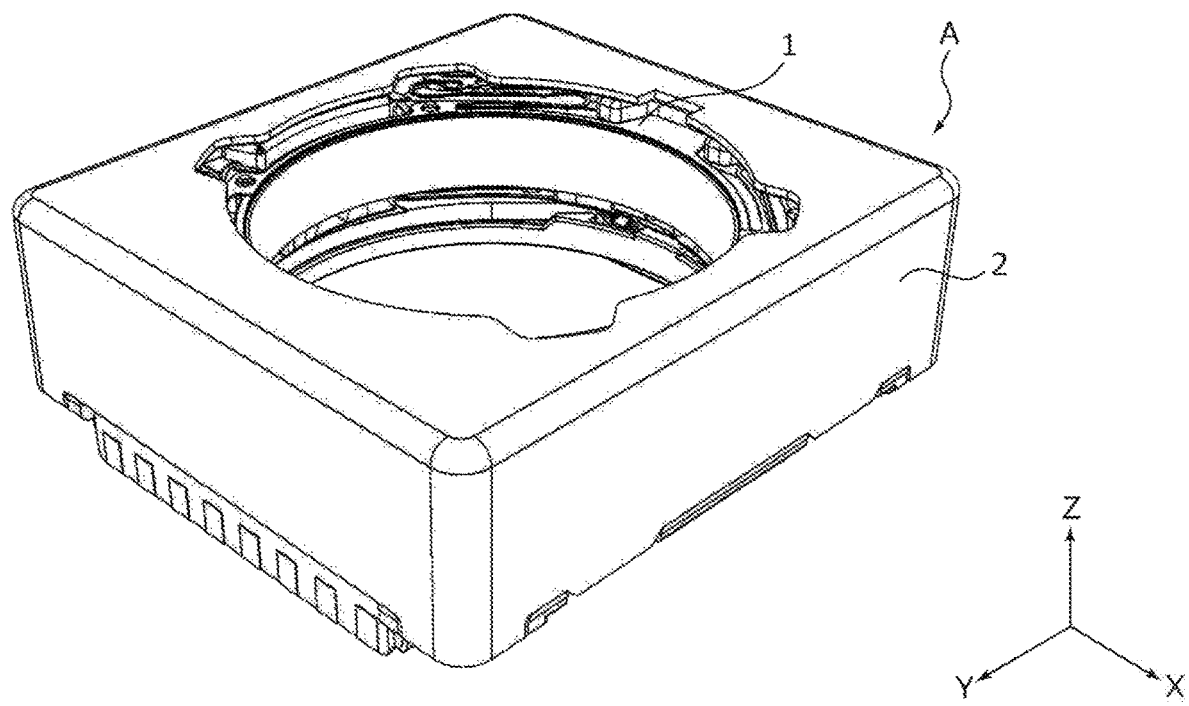
FIG. 2 is a perspective view of an external appearance of the camera module.
Figure 3:
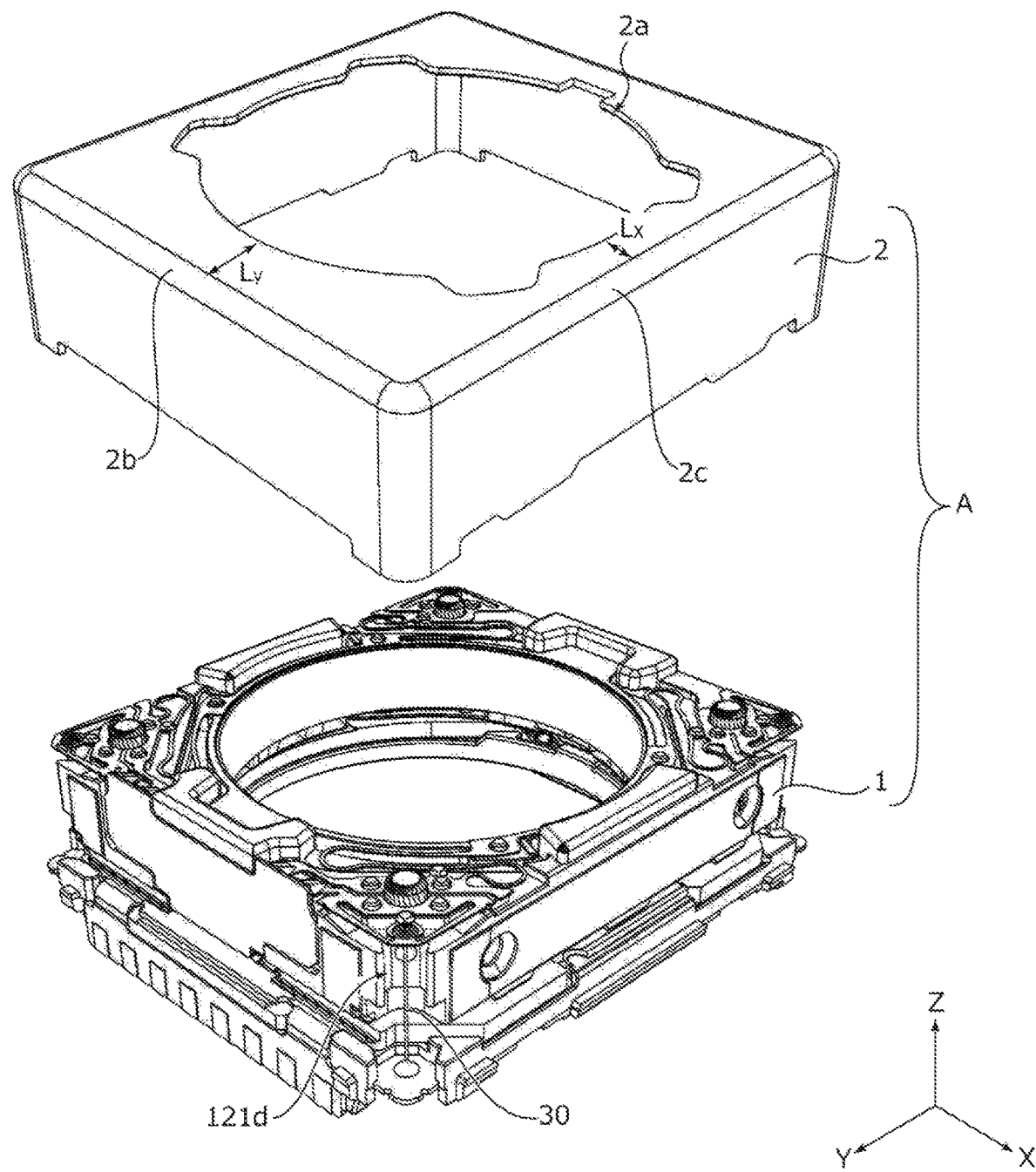
FIG. 3 is an exploded perspective view of the camera module.
Figure 4:
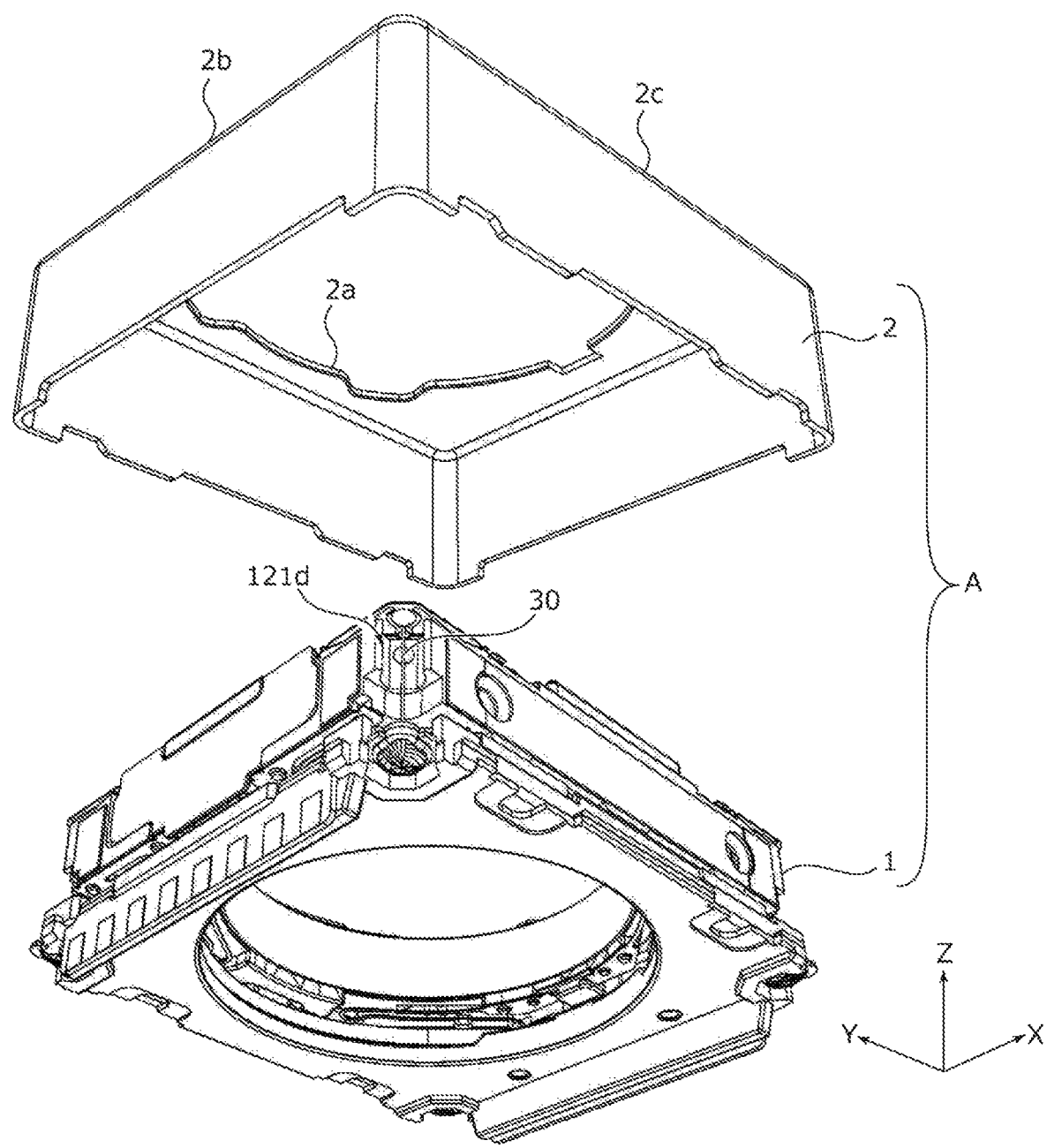
FIG. 4 is an exploded perspective view of the camera module.

FIG. 2 is a perspective view of an external appearance of camera module A. FIGS. 3 and 4 are exploded perspective views of camera module A. FIG. 3 is an upper perspective view and FIG. 4 is a lower perspective view. The embodiments will be described using an orthogonal coordinate system (X, Y, Z) as illustrated in FIGS. 2 to 4. The same orthogonal coordinate system (X, Y, Z) is also used for illustration of below-mentioned figures. Moreover, in the descriptions, the intermediate directions of the X and Y directions, that is, the diagonal directions in the plan-view shape of camera module A as seen in the Z direction are referred to as the U direction and V direction (see FIG. 10).

Camera module A is mounted such that the vertical direction (or horizontal direction) is the X direction, the horizontal direction (or vertical direction) is the Y direction, and the front-rear direction is the Z direction during actually capturing an image with smartphone M. That is, the Z direction is the optical-axis direction, the upper side in the figures is the light reception side in the optical-axis direction, and the lower side is the image formation side in the optical-axis direction. In addition, the X and Y directions orthogonal to the Z axis are referred to as "optical-axis-orthogonal directions" and the XY plane is referred to as "optical-axis-orthogonal plane."

Camera module A includes lens driving device 1 that achieves the AF function and the OIS function, a lens part (not illustrated) composed of a cylindrical lens barrel and a lens housed therein, an image capturing part (not illustrated) configured to capture a subject image imaged by the lens part, cover 2 entirely covering camera module A, and the like.

Cover 2 is a capped rectangular cylindrical member having a square shape in plan view as seen in the optical-axis direction. Cover 2 includes, in its upper surface, substantially circular opening 2a. The lens part (not illustrated) faces outside from this opening 2a. Cover 2 is fixed to base 21 (see FIGS. 15 and 16) of OIS fixing part 20 of lens driving device 1.

At the upper surface of cover 2, distance Lx between second cover edge 2c extending along the Y axis and opening 2a is shorter than distance Ly between first cover edge 2b extending along the X axis and opening 2a. That is, first cover edge 2b is shorter than second cover edge 2c. In this way, camera module A has an external shape in plan view that is smaller than a square with a side length the same as second cover edge 2c; that is, the miniaturization is achieved (slim border design is achieved).

The image capturing part (not illustrated) is disposed on the image formation side of lens driving device 1 in the optical-axis direction. The image capturing part includes, for example, an imaging device (not illustrated) such as a charge-coupled device (CCD) image sensor, a complementary metal oxide semiconductor (CMOS) image sensor, or the like and a sensor board on which the imaging device is mounted. The imaging device captures a subject image imaged by the lens part (not illustrated). Lens driving device 1 is mounted on the sensor board (not illustrated) and electrically connected to the sensor board.

Figure 5:
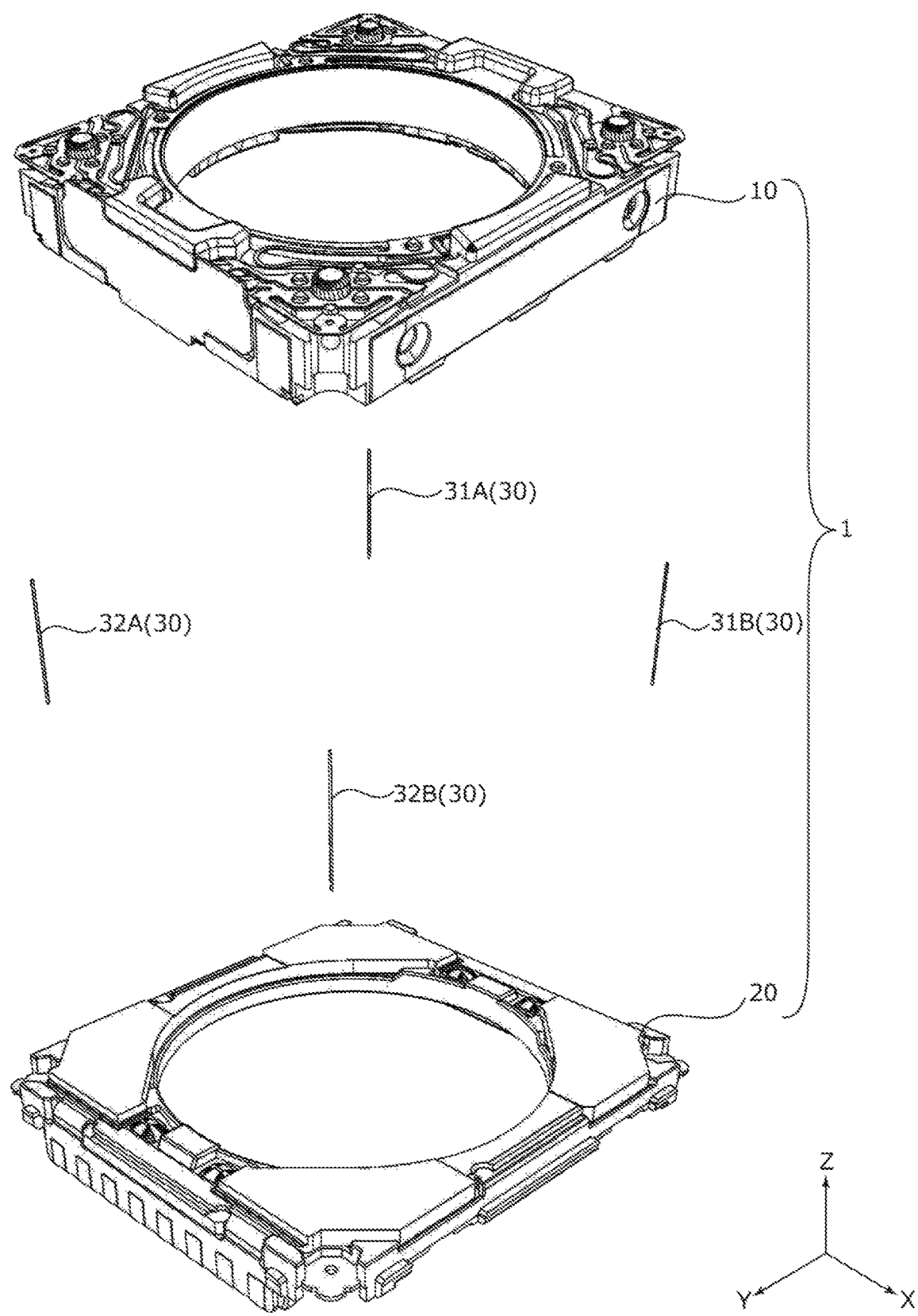
FIG. 5 is an exploded perspective view of a lens driving device.
Figure 6:
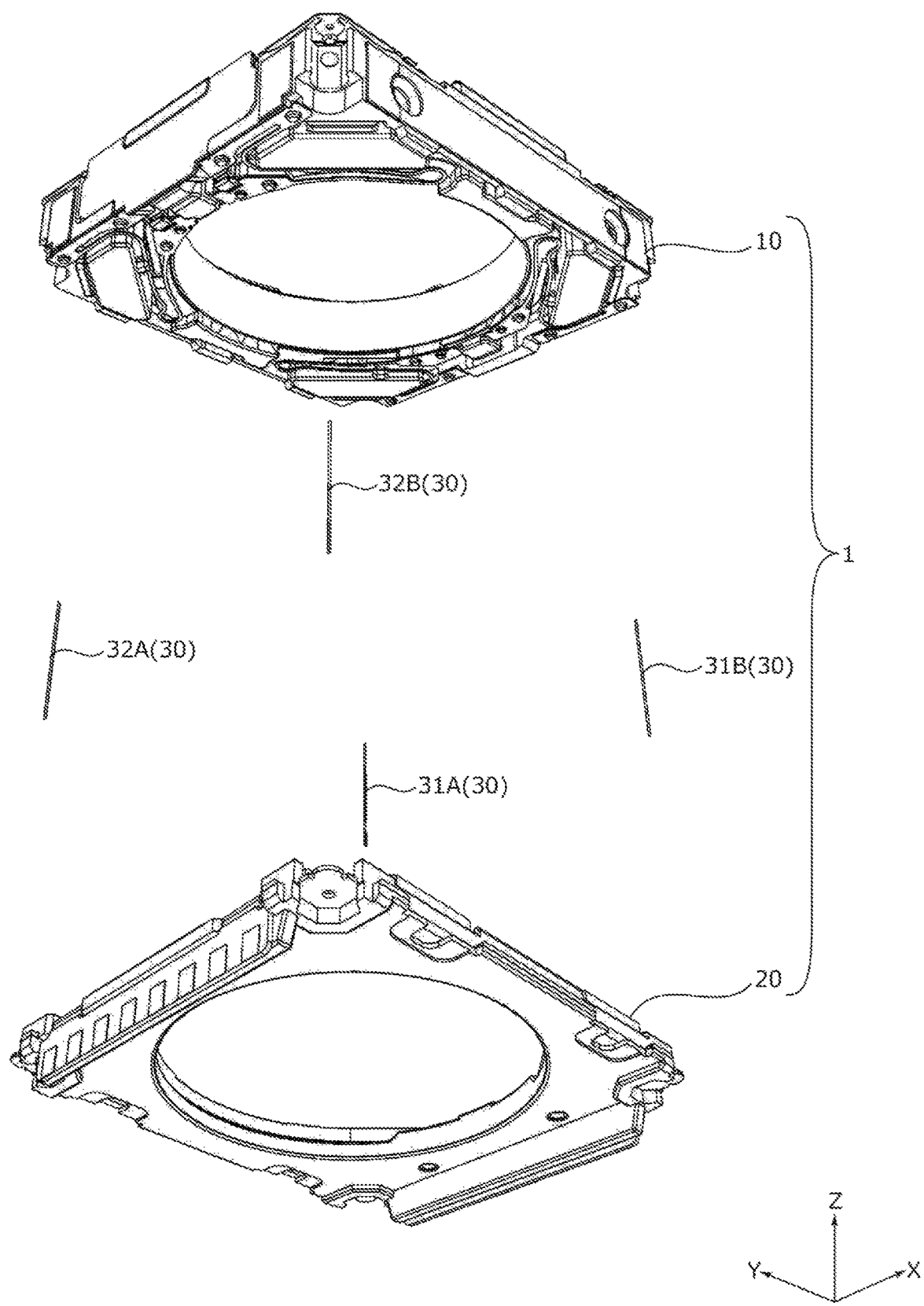
FIG. 6 is an exploded perspective view of the lens driving device.

FIGS. 5 and 6 are exploded perspective views of lens driving device 1. FIG. 5 is an upper perspective view and FIG. 6 is a lower perspective view.

As illustrated in FIGS. 5 and 6, lens driving device 1 includes OIS movable part 10, OIS fixing part 20, OIS supporting part 30, and the like.

OIS movable part 10 includes an OIS magnet part being a component of an OIS voice coil motor, and sways in the optical-axis-orthogonal plane during shake correction. OIS fixing part 20 includes an OIS coil part being a component of the OIS voice coil motor, and supports OIS movable part 10 via OIS supporting part 30. That is, the moving-magnet system is employed in the OIS driving part of lens driving device 1. OIS movable part 10 includes an AF driving part (AF movable part 11 and AF fixing part 12 (see FIGS. 7 and 8)).

OIS movable part 10 is disposed to be spaced apart from OIS fixing part 20 on the light reception side in the optical-axis direction, and is coupled to OIS fixing part 20 by OIS supporting part 30. Specifically, OIS supporting part 30 is composed of four suspension wires extending in the optical-axis direction (hereinafter referred to as "suspension wires 30"). One ends (upper ends) of suspension wires 30 are fixed to OIS movable part 10 (to AF supporting part 13, AF power-supply lines 171 and 172 (see FIGS. 7 and 8)), and the other ends (lower ends) are fixed to OIS fixing part 20 (to base 21, (see FIGS. 15 and 16)). OIS movable part 10 is supported by suspension wires 30 in such a manner as to be able to sway in the optical-axis-orthogonal plane.

In the embodiments of the present invention, suspension wires 31A and 31B of four suspension wires 30 are used as signal paths for conveying control signals to AF control part 16 (control IC 161 (see FIG. 12A)) (these suspension wires 31A and 31B may also hereinafter be referred to as "signal suspension wires 31A and 31B"). Suspension wires 32A and 32B are used as power-supplying paths to AF control part 16 (control IC 161) (these suspension wires 32A and 32B may also hereinafter be referred to as "power-supplying suspension wires 32A and 32B").

Figure 7:
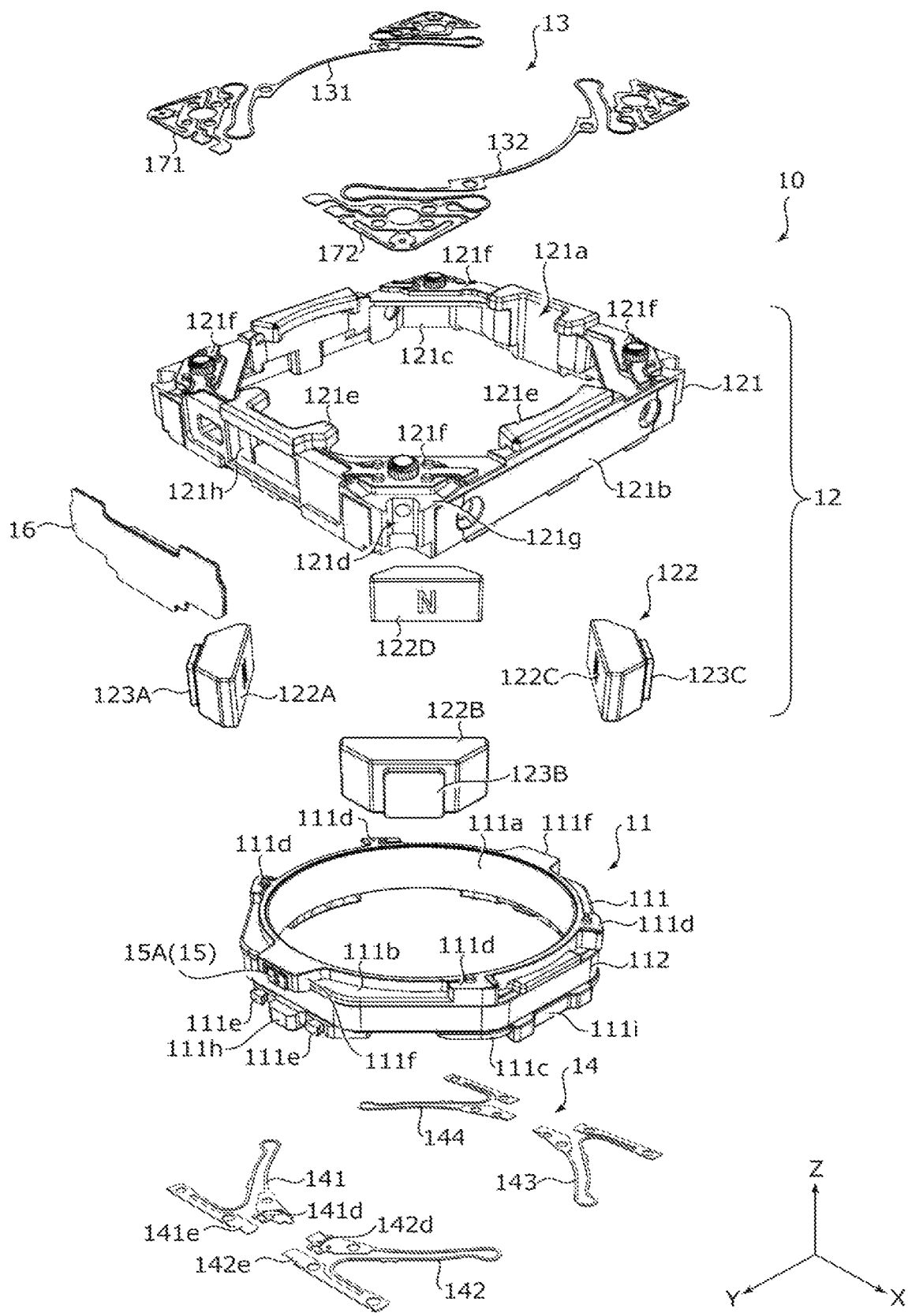
FIG. 7 is an exploded perspective view of an OIS movable part.
Figure 8:
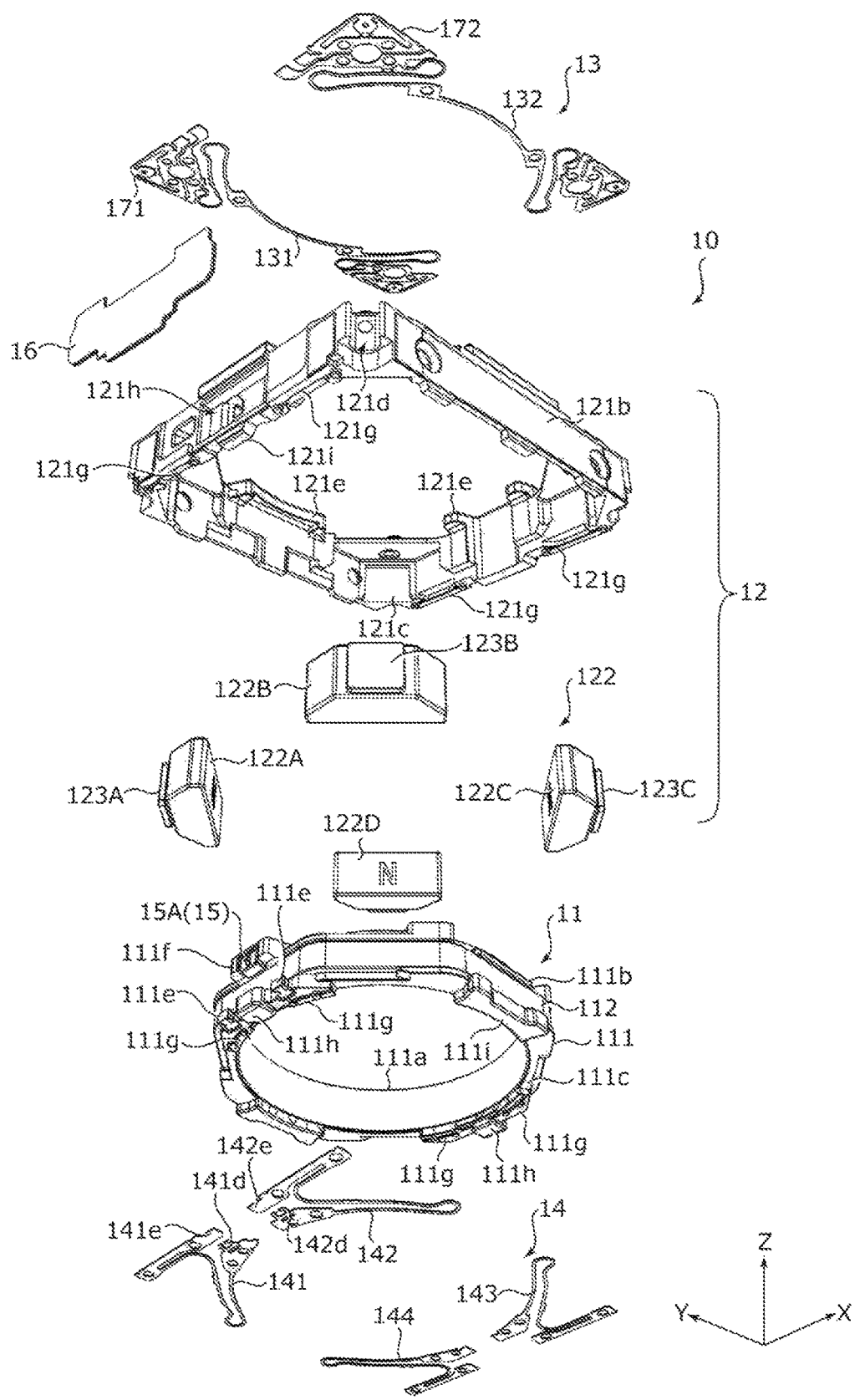
FIG. 8 is an exploded perspective view of the OIS movable part.

FIGS. 7 and 8 are exploded perspective views of OIS movable part 10. FIG. 7 is an upper perspective view and FIG. 8 is a lower perspective view.

As illustrated in FIGS. 7 and 8, OIS movable part 10 includes AF movable part 11, AF fixing part 12, AF supporting parts 13 and 14, AF power-supply lines 171 and 172, and the like. AF movable part 11 is disposed to be radially inwardly spaced apart from AF fixing part 12, and is coupled to AF fixing part 12 by AF supporting parts 13 and 14.

AF movable part 11 includes AF coil part 112 being a component of the AF voice coil motor, and moves in the optical-axis direction during focusing. AF fixing part 12 includes magnet part 122 (AF magnet part) being a component of the AF voice coil motor, and supports AF movable part 11 via AF supporting parts 13 and 14. That is, the moving-coil system is employed in the AF driving part of lens driving device 1.

AF movable part 11 includes lens holder 111, AF coil part 112, and position-detecting magnet 15 (see FIG. 7).

Lens holder 111 includes cylindrical lens housing 111a and upper flange 111b and lower flange 111c each protruding radially outward from lens housing 111a. That is, lens holder 111 includes a bobbin structure. Upper and lower flanges 111b and 111c have a substantially octagonal shape in plan view. The upper surface of upper flange 111b serves as a locking portion for restricting the movement of AF movable part 11 toward the light reception side in the optical-axis direction.

AF coil part 112 is wound on a portion sandwiched between upper and lower flanges 111b and 111c (this portion may also hereinafter be referred to as "coil winding portion"). The coil winding portion (whose reference numeral is omitted) has a substantially regular octagonal shape in plan view. With this configuration, a load to be applied to the coil winding portion when AF coil part 112 is wound directly on the coil winding portion is made uniform, and the strength of the coil winding portion is also made substantially uniform relative to the center, so that deformation of the opening of lens housing 111a can be prevented and the roundness can be maintained.

It is preferable that the inner peripheral surface of lens housing 111a include a groove (not illustrated) to which an adhesive is applied. In a case of the method for mounting the lens part (not illustrated) to lens housing 111a by screwing, there is a risk that suspension wires 30 supporting OIS movable part 10 may be damaged. In contrast, in the embodiments of the present invention, the lens part (not illustrated) is adhesively fixed to the inner peripheral surface of lens housing 111a, so that suspension wires 30 can be prevented from being damaged during attachment of the lens part. Additionally, the groove in the inner peripheral surface of lens housing 111a holds therein a proper amount of adhesive, so that the adhesive strength between lens holder 111 and the lens part is enhanced.

Lens holder 111 includes four upper-spring fixing portions 111d used for fixing AF supporting part 13 at the upper outer periphery of lens housing 111a. Lens holder 111 includes four lower-spring fixing portions 111g used for fixing AF supporting part 14 at the undersurface of lower flange 111c.

Lens holder 111 also includes magnet housings 111f that house position-detecting magnets 15 (15A, 15B) at the upper outer periphery of lens housing 111a, particularly, at portions of upper flange 111b. In the embodiments of the present invention, two magnet housings 111f are disposed opposite each other in the Y direction that is the longitudinal direction. Specifically speaking, magnet housings 111f are provided respectively at positions corresponding to the middles between spaced-apart permanent magnets 122A and 122B and between spaced-apart permanent magnets 122C and 122D adjacent to each other in the X direction that is the transverse direction. Note that, magnet housings 111f may also be provided at portions of lower flange 111c.

Lens holder 111 includes tying parts 111e protruding radially outward from two of four lower-spring fixing portions 111g. Ends of AF coil part 112 are tied to tying parts 111e, respectively. Lens holder 111 also includes protruding portions 111h radially protruding to isolate each of tying parts 111e. One of protruding portions 111h is disposed between tying parts 111e. Protruding portions 111h spatially separate from each other the both ends of AF coil part 112 tied to tying parts 111e, to secure the insulation property, so as to improve the safety and reliability.

Lens holder 111 also includes holder-side contact portions 111i at portions of lower flange 111c. Holder-side contact portions 111i protrude beyond their respective surrounding regions on the image formation side in the optical-axis direction. The undersurfaces of holder-side contact portions 111i serve as locking portions for restricting the movement of AF movable part 11 toward the image formation side in the optical-axis direction. In the embodiments of the present invention, two holder-side contact portions 111i are provided opposite each other in the X direction. Holder-side contact portions 111i come into contact with the upper surface of coil board 22 (see FIGS. 15 and 16) of OIS fixing part 20.

In the embodiments of the present invention, lens holder 111 is formed from a molding material consisting of polyarylate (PAR) or a PAR alloy which is a mixture of multiple resin materials including PAR. In particular, it is preferable that the PAR alloy be a polymer alloy (PAR/PC) consisting of PAR and polycarbonate (PC). With this molding material, the weld strength is increased as compared with conventional molding materials (e.g. liquid crystal polymer (LCP)) and, thus, the toughness and impact resistance can be secured even when lens holder 111 is thin-walled. It is thus possible to make the external size of lens driving device 1 smaller and to achieve the miniaturization and weight reduction.

Additionally, lens holder 111 is preferably formed by injection molding using multiple gates. In this case, the gate diameter is preferably 0.3 mm or greater. Such injection molding brings about a better fluidity during molding, so as to allow thin-wall molding and besides, to make it possible to prevent occurrence of sink marks even when the PAR or PAR alloy is used as molding material.

It is preferable that the molding material consisting of the PAR or PAR alloy be conductive and, in particular, have a volume resistivity of from $10^9$ Ω·cm to $10^{11}$ Ω·cm. For example, it is possible to easily impart conductivity to an existing PAR or PAR alloy by mixing carbon nanotubes into such an existing PAR or PAR alloy. At this time, suitable conductivity can be imparted by adjusting the content of carbon nanotubes. Such adjustment makes it possible to reduce electrification of lens holder 111 and thus to prevent occurrence of static electricity.

It is also preferable that the molding material consisting of the PAR or PAR alloy contain fluoride. By the contained fluoride, the intermolecular forces become weaker, so that the adsorptive power of portions of lens holder 111 (holder-side contact portions 111i) coming into contact with coil board 22 decreases and the slidability improves. Accordingly, it is possible to prevent dust generation due to friction during contact between lens holder 111 and coil board 22.

Thus, with the above-described configuration of lens holder 111, it is made possible to achieve the miniaturization and weight reduction of lens driving device 1 and to improve the reliability.

AF coil part 112 is an air core coil to be energized at the time of focusing, and is wound on the outer peripheral surface of coil winding portion of lens holder 111. The both ends of AF coil part 112 are tied to tying parts 111e of lens holder 111, respectively. AF coil part 112 is energized via AF supporting part 14 (lower plate springs 141 and 142). The energization current through AF coil part 112 is controlled by AF control part 16 (control IC 161 (see FIG. 12A)).

Position-detecting magnets 15 are disposed in magnet housings 111f of lens holder 111. That is, position-detecting magnets 15 are disposed respectively at the positions corresponding to the middles between spaced-apart permanent magnets 122A and 122B and between spaced-apart permanent magnets 122C and 122D. Position-detecting magnets 15 include first position-detecting magnet 15A disposed in magnet housing 111f on the side corresponding to AF control part 16 and second position-detecting magnet 15B disposed in magnet housing 111f on the opposite side (see FIGS. 9 and 10). First position-detecting magnet 15A is used for position detection of AF movable part 11 in the optical-axis direction. Second position-detecting magnet 15B is a dummy magnet which is not used for position detection of AF movable part 11.

Second position-detecting magnet 15B is disposed in order to balance the magnetic forces which act on AF movable part 11 to stabilize the attitude of AF movable part 11. That is, since, when second position-detecting magnet 15B is not disposed, an unbalanced magnetic force caused by the magnetic field generated by magnet part 122 acts on AF movable part 11, so as to make the attitude of AF movable part 11 unstable. In order to prevent this, second position-detecting magnet 15B is disposed.

Figure 9:
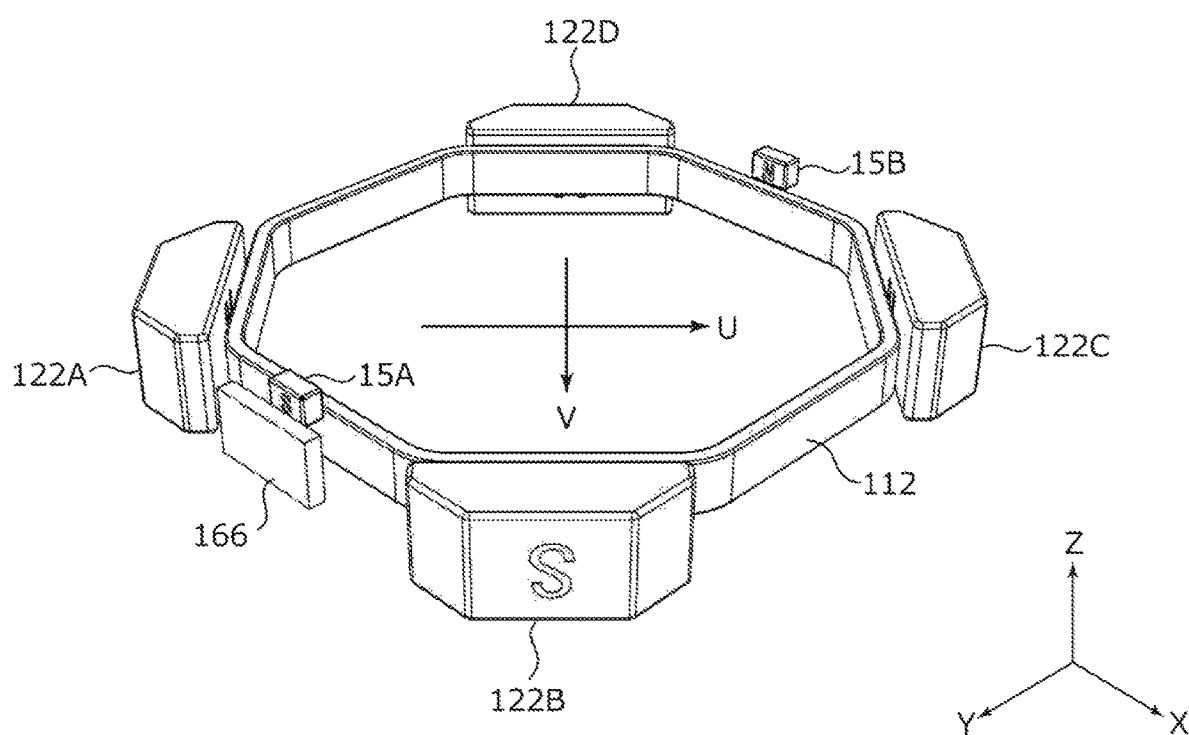
FIG. 9 is a perspective view illustrating arrangement of position-detecting magnets and an AF printed wiring board.
Figure 10:
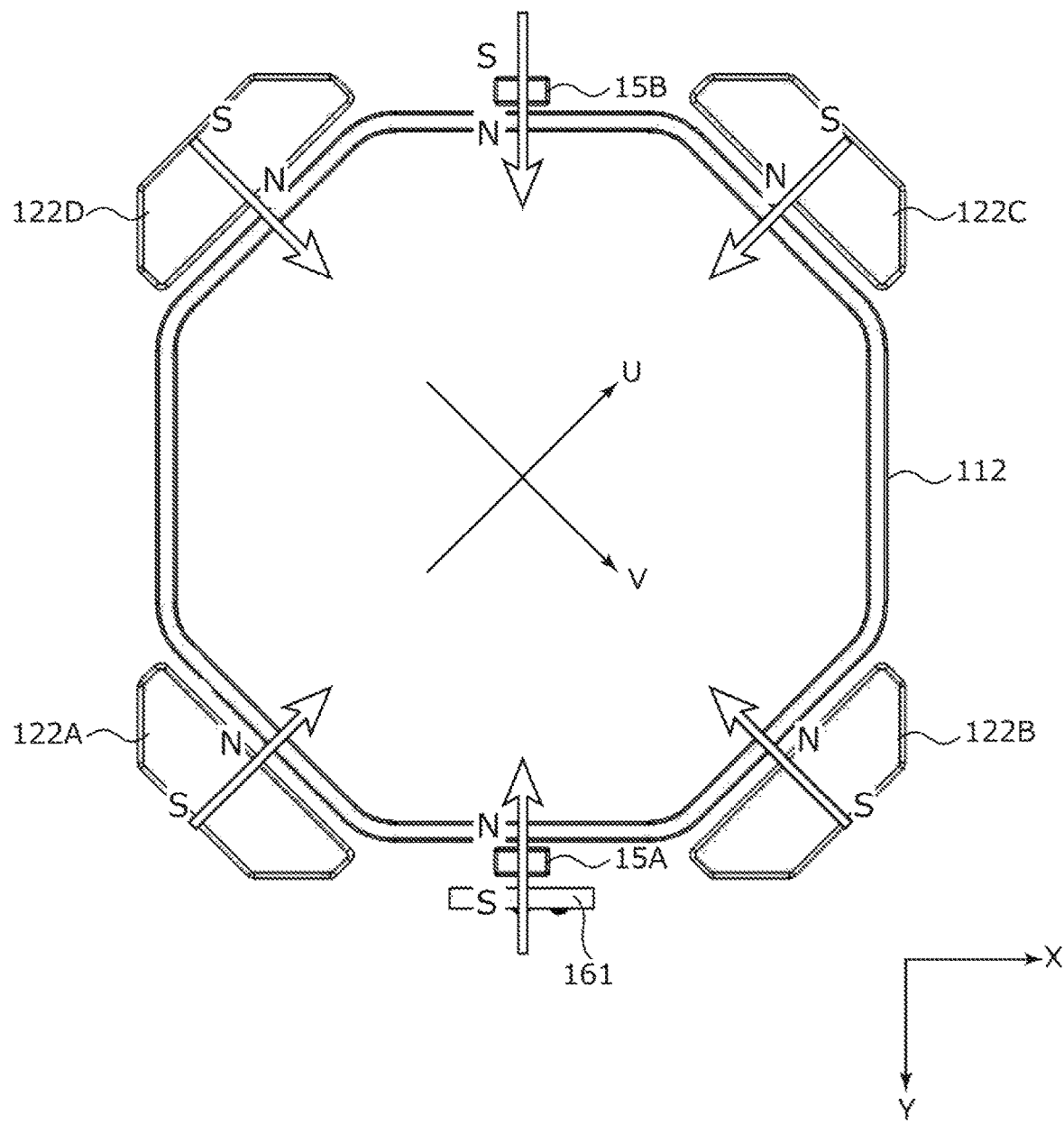
FIG. 10 is a plan view illustrating the directions of the magnetic fields at an AF movable part.

In the embodiments of the present invention, first and second position-detecting magnets 15A and 15B are, like permanent magnets 122A to 122D, radially magnetized and the magnetization directions are also the same as those of permanent magnets 122A to 122D (see FIGS. 9 and 10). Specifically, first and second position-detecting magnets 15A and 15B are magnetized such that the inner periphery side and the outer periphery side of position-detection magnets 15A and 15B are set to N pole and S pole, respectively.

It is preferable that the width of each of first and second position-detecting magnets 15A and 15B in the optical-axis-orthogonal direction (the width in the Y direction in this case) be smaller than the height of each of first and second position-detecting magnets 15A and 15B in the optical-axis direction. This makes it possible to achieve thin-walled lens holder 111 while securing the magnetic flux densities of magnetic fluxes emitted by first and second position-detecting magnets 15A and 15B. The detailed arrangement of first and second position-detecting magnets 15A and 15B (positional relationship with AF control part 16) will be described below.

AF fixing part 12 includes magnet holder 121, magnet part 122, yoke 123 and AF control part 16.

Magnet holder 121 is a substantially rectangular cylindrical holding member including four side walls 121b coupled to one another. The lengths of those of side walls 121b extending along the X direction are shorter than the lengths of those of side walls 121b extending along the Y direction. Magnet holder 121 includes opening 121a formed by cutting out portions corresponding to lens housing 111a, upper-spring fixing portions 111d, and magnet housings 111f of lens holder 111.

Magnet holder 121 includes magnet holding portions 121c adapted to hold magnet part 122 at the insides of coupled portions of four side walls 121b (four corners of magnet holder 121). Magnet holder 121 includes wire insertion portions 121d depressed radially inward into the shape of a circular arc at the outsides of the coupled portions of side walls 121b. Suspension wires 30 are disposed in wire insertion portions 121d (see FIGS. 3 and 4). Interference between suspension wires 30 and magnet holder 121 during sway of OIS movable part 10 can be avoided by providing wire insertion portions 121d.

Magnet holder 121 includes stopper portions 121e projecting radially inward at upper portions of side walls 121b. When AF movable part 11 moves toward the light reception side in the optical-axis direction, stopper portions 121e come into contact with upper flange 111b of lens holder 111, so as to restrict the movement of AF movable part 11 toward the light reception side in the optical-axis direction. In the embodiments of the present invention, stopper portions 121e are provided at four places, where two of stopper portions 121e are opposite to each other in the X direction and the other two in the Y direction.

Magnet holder 121 includes upper-spring fixing portions 121f for fixing AF supporting part 13 and AF power-supply lines 171 and 172 at the four corners of the upper surfaces of side walls 121b. Magnet holder 121 also includes lower-spring fixing portions 121g for fixing AF supporting part 14 on the undersurfaces of side walls 121b extending along the X-axis. Magnet holder 121 also includes protruding portion 121i protruding in the optical-axis direction in such a manner as to isolate each of two of lower-spring fixing portions 121g. Protruding portion 121i is disposed between adjacent lower-spring fixing portions 121g. That is, protruding portion 121i is arranged between power-supply output terminals 162a and 162b in the state where AF control part 16 is attached (see FIG. 12). Protruding portion 121i spatially separates power-supply output terminals 162a and 162b from each other to secure the insulation property, so as to improve the safety and reliability.

Upper-spring fixing portions 121f include corner portions which are each formed with a downward depression lower than the upper surface of magnet holder 121 (the surface to which AF supporting part 13 or AF power-supply lines 171 and 172 are attached), and are each formed such that a gap is formed between the corner portion and AF supporting part 13 or AF power-supply lines 171 and 172 after attachment of AF supporting part 13 or AF power-supply lines 171 and 172. Magnet holder 121 also includes IC housing 121h for housing AF control part 16 in one of side walls 121b extending along the X direction.

In the embodiments of the present invention, like lens holder 111, magnet holder 111 is formed from a molding material consisting of polyarylate (PAR) or a PAR alloy (e.g. PAR/PC) which is a mixture of multiple resin materials including PAR. With this molding material, the weld strength is increased and, thus, the toughness and impact resistance can be secured even when magnet holder 121 is thin-walled. It is thus possible to make the external size of lens driving device 1 smaller and to achieve the miniaturization and height reduction.

Additionally, magnet holder 121 is preferably formed by injection molding using multiple gates. In this case, the gate diameter is preferably 0.3 mm or greater. Such injection molding brings about a better fluidity during molding, so as to allow thin-wall molding and besides, to make it possible to prevent occurrence of sink marks even when the PAR or PAR alloy is used as molding material.

It is preferable that the molding material consisting of the PAR or PAR alloy be conductive and, in particular, have a volume resistivity of from $10^9$ $\Omega \cdot cm$ to $10^{11}$ $\Omega \cdot cm$. For example, it is possible to easily impart conductivity to an existing PAR or PAR alloy by mixing carbon nanotubes into such an existing PAR or PAR alloy. At this time, suitable conductivity can be imparted by adjusting the content of carbon nanotubes. Such adjustment makes it possible to reduce electrification of magnet holder 121 and thus to prevent occurrence of static electricity.

It is also preferable that the PAR or PAR alloy contain fluoride. By the contained fluoride, the intermolecular forces become weaker, so that the adsorptive power of portions of magnet holder 121 coming into contact with lens holder 111 decreases and the slidability improves. Accordingly, it is possible to prevent dust generation due to friction during contact between lens holder 111 and magnet holder 121.

Magnet part 122 includes four rectangular columnar permanent magnets 122A to 122D. Permanent magnets 122A to 122D are fixed, for example adhesively, to magnet holding portions 121c, respectively. In the embodiments of the present invention, permanent magnets 122A to 122D each have the shape of a substantially isosceles trapezoid in plan view. Such a shape makes it possible to effectively utilize the spaces at the corners of magnet holder 121 (magnet holding portions 121c). Permanent magnets 122A to 122D are each magnetized such that a magnetic field radially traversing AF coil part 112 is formed at AF coil part 112. In the embodiments of the present invention, permanent magnets 122A to 122D are magnetized such that the inner periphery sides and the outer periphery sides of permanent magnets 122A to 122D are set to N pole and S pole, respectively.

The undersurfaces of permanent magnets 122A to 122D protrude from magnet holder 122 toward the image formation side in the optical-axis direction (see FIG. 6). That is, the height of OIS movable part 10 is determined by permanent magnets 122A to 122D. Thus, the height of OIS movable part 10 can be minimized according to the sizes of permanent magnets 122A to 122D enough to secure the magnetic forces, so that height reduction of lens driving device 1 can be achieved.

Permanent magnets 122A to 122D include yokes 123A to 123D disposed on the back surfaces (surfaces on the outer periphery side) of permanent magnets 122A to 122D. For example, yokes 123A to 123D are adhered to magnet holding portions 121c of magnet holder 121, and thereafter, permanent magnets 122A to 122D are adhered. The magnetic fluxes which cross OIS coils 221A to 221D (see FIG. 15) are increased by disposing yokes 123A to 123D, so that it is possible to increase the thrust for shake-correcting operation.

Magnet part 122 and coil part 112 constitute the AF voice coil motor. In the embodiments of the present invention, magnet part 122 serves as both of the AF magnet part and the OIS magnet part.

Figure 12A:
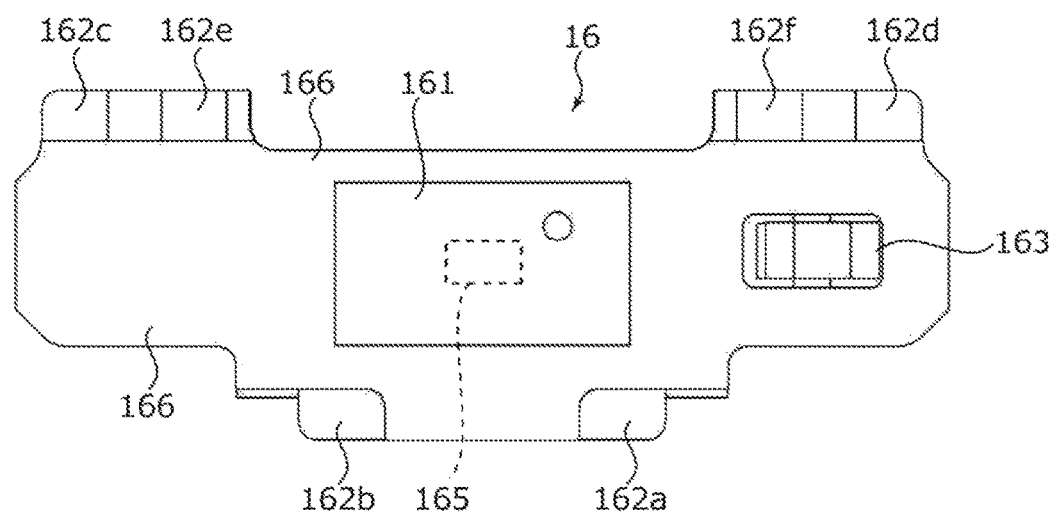
FIGS. 12A and 12B illustrate a configuration of an AF control part.
Figure 12B:
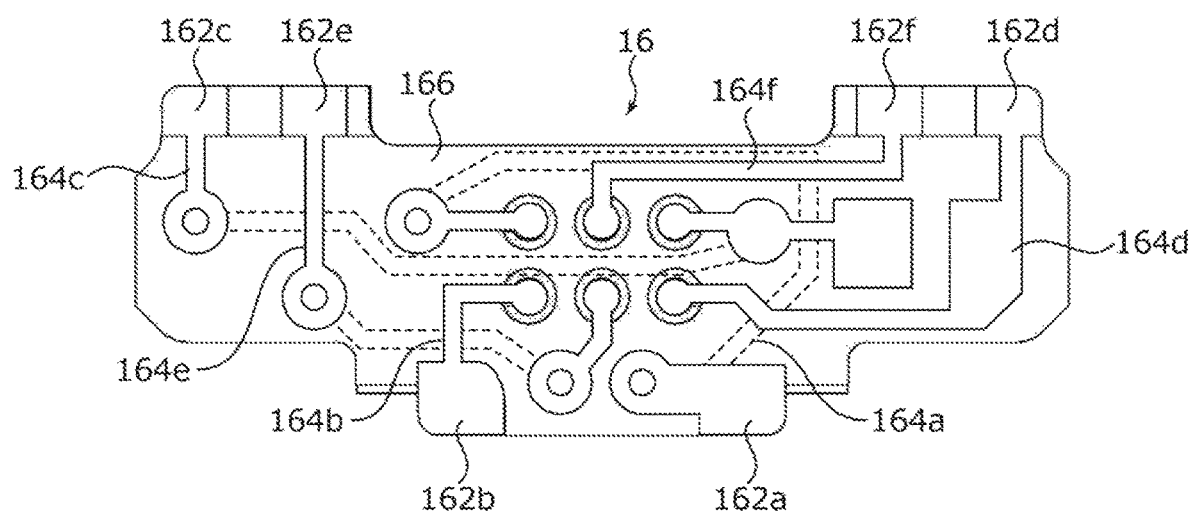

AF control part 16 includes control IC 161, bypass capacitor 163, and AF printed wiring board 166 on which control IC 161 and bypass capacitor 163 are mounted (see FIGS. 12A and 12B). AF control part 16 is fixed, for example adhesively, to IC housing 121h of magnet holder 121. At this time, control IC 161 and bypass capacitor 163 are fit in the opening (whose reference numeral is omitted) of IC housing 121h.

Control IC 161 includes built-in Hall element 165 that utilizes the Hall effect to detect the change of the magnetic field, and functions as a Z position detector. When AF movable part 11 moves in the optical-axis direction, the magnetic field by first position-detecting magnet 15A changes. Hall element 165 detects this change in magnetic field, and accordingly, the position of AF movable part 11 in the optical-axis direction is detected. The layouts of Hall element 165 and position-detecting magnet 15 are designed such that the magnetic flux proportional to the movement amount of AF movable part 11 crosses the detection surface of Hall element 165. Accordingly, it is made possible to obtain the Hall output proportional to the movement amount of AF movable part 11.

Figure 11A:
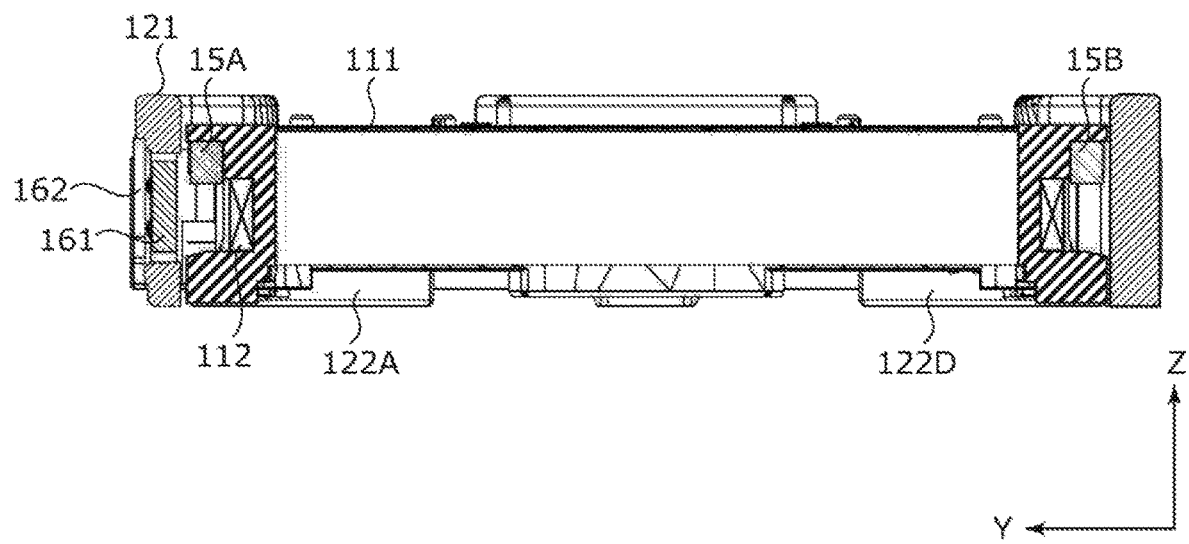
FIGS. 11A and 11B are sectional views of the YZ plane through a first position-detecting magnet.
Figure 11B:
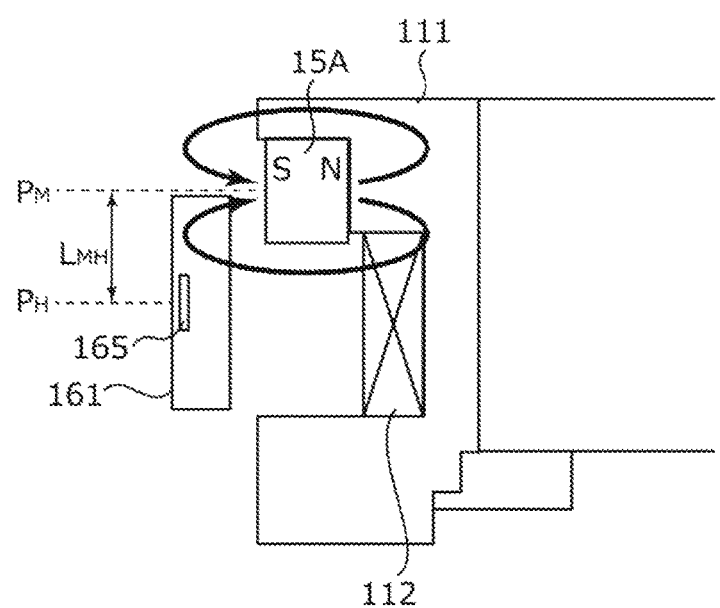

As illustrated in FIGS. 9, 10, 11A, and 11B, control IC 161 is disposed to face first position-detecting magnet 15A such that the magnetic flux of first position-detecting magnet 15A radially crosses the detection surface of Hall element 165. FIG. 11B is an enlarged view of the periphery of first position-detecting magnet 15A. In the embodiments of the present invention, the detection surface of Hall element 165 is parallel to the XZ plane.

As described above, first and second position-detecting magnets 15A and 15B are radially magnetized like permanent magnets 122A to 122D. In a case where position-detecting magnet 15 is disposed such that the magnetization direction is parallel to the optical-axis direction and the layouts of the Hall element and the position-detecting magnet are set such that the zero-crossing (zero magnetic field) occurs at a neutral point (point where AF coil part 112 is not energized and AF movable part 11 is magnetically stable), there is a risk that the neutral point of AF movable part 11 shifts from the designed position since the magnetic force acts on position-detecting magnet 15 in the optical-axis direction due to the influence of magnetism by magnet part 122.

In contrast, in the embodiments of the present invention, position-detecting magnet 15 is radially magnetized, so that the magnetic force in the optical-axis direction which acts on position-detecting magnet 15 due to the influence of the magnetism by magnet part 122 is decreased. Therefore, it is possible to prevent the neutral point of AF movable part 11 from shifting, so that the position detection accuracy in detecting the position of AF movable part 11 in the optical-axis direction improves and the reliability improves.

Additionally, the magnetization direction of first position-detecting magnet 15A is orthogonal to the detection surface of Hall element 165. Thus, the magnetic flux density of the magnetic flux which crosses the detection surface is high, so that the Hall output can be obtained more as compared with a case where the magnetization direction is parallel to the detection surface of Hall element 165. Moreover, since the magnetization direction of first position-detecting magnet 15A is the same as that of magnet part 122, the magnetic flux of first position-detecting magnet 15A which crosses the detection surface of Hall element 165 is not canceled by the magnetic flux of magnet part 122. Accordingly, position-detecting magnet 15 can be downsized, so that it is possible to achieve the miniaturization and weight reduction of lens driving device 1.

Furthermore, first position-detecting magnet 15A is disposed radially nearer to Hall element 165 than to AF coil part 112. In other words, first position-detecting magnet 15A is disposed radially between Hall element 165 and AF coil part 112. Accordingly, it becomes more difficult for Hall element 165 to be influenced by AF coil part 112, so that the position detection accuracy improves.

Note that, there is a risk that the linearity (straightness) of the Hall output decreases in cases of the embodiments of the present invention, as compared with the case where the magnetization direction of position-detecting magnet 15 is made parallel to the optical-axis direction and the position of the zero-crossing is set to the neutral point. Then, preferably, control IC 161 includes a linearity correcting function. This function makes it possible to secure the linearity of the Hall output, so that the position detection accuracy in detecting the position of AF movable part 11 in the optical-axis direction improves.

Additionally, first position-detecting magnet 15A is disposed to be offset from Hall element 165 in the optical-axis direction. In the embodiments of the present invention, first position-detecting magnet 15A is disposed to be offset from Hall element 165 on the light reception side in the optical-axis direction. That is, center position $P_M$ of first position-detecting magnet 15A in the optical-axis direction is offset from center position $P_H$ of Hall element 165 on the light reception side in the optical-axis direction (see FIG. 11B).

In this case, it is preferable that center position $P_M$ of first position-detecting magnet 15A be disposed on the light reception side relative to center position $P_H$ of Hall element 165 in the optical-axis direction after AF movable part 10 moves as far as possible toward the image formation side in the optical-axis direction. That is, it is preferable that distance $L_{MH}$ between the center of first position-detecting magnet 15A and the center of Hall element 165 in the optical-axis direction be greater than a movement stroke of AF movable part 11 on the image formation side in the optical-axis direction (this movement stroke may hereinafter also be referred to as "downward stroke"). In other words, it is preferable that the offset between first position-detecting magnet 15A and Hall element 165 in the optical-axis direction be greater than a stroke of AF movable part 11 on the side opposite to the offset side. In the embodiments of the present invention, distance $L_{MH}$ between the center of first position-detecting magnet 15A and the center of Hall element 165 in the optical-axis direction is twice the downward stroke or greater. With this configuration, the magnetic flux which crosses the detection surface of Hall element 165 increases or decreases monotonically along with automatic focusing operation, so that it is possible to calculate the position of AF movable part 11 in the optical-axis direction easily and accurately based on the Hall output.

Note that, first position-detecting magnet 15 may also be disposed to be offset from Hall element 165 on the image formation side in the optical-axis direction. In this case, it is preferable that distance $L_{MH}$ between the center of first position-detecting magnet 15A and the center of Hall element 165 in the optical-axis direction be greater than a movement stroke of AF movable part 11 on the light reception side in the optical-axis direction (this movement stroke may hereinafter also be referred to as "upward stroke").

Thus, with the above-described configuration of Hall element 165 and position-detecting magnet 15, it is made possible to achieve the miniaturization and weight reduction of lens driving device 1 and to improve the reliability.

FIGS. 12A and 12B illustrate a configuration of AF control part 16. FIG. 12A is a side view of AF control part 16 as seen from the base end side in the Y direction. FIG. 12B illustrates a wiring pattern of AF printed wiring board 166.

As illustrated in FIGS. 12A and 12B, AF printed wiring board 166 includes power-supply output terminals 162a and 162b, power-supply input terminals 162c and 162d, signal input terminals 162e and 162f, and a conductor pattern including interconnections 164a to 164f. In FIG. 12B, part of the conductor pattern formed on the front surface is indicated by the solid line, and part of the conductor pattern formed on the back surface is indicated by the dotted line. Interconnections 164a to 164f are formed on the front and back surfaces of AF printed wiring board 166. Those of interconnections 164a to 164f formed on the front surface and those of interconnections 164a to 164f formed on the back surface of the base material are connected to each other via a through hole (not illustrated). In AF printed wiring board 166, the front and back surfaces are covered with a resist film (whose reference numeral is omitted), and terminals 162a to 162f are exposed from the resist film.

Power-supply output terminals 162a and 162b are electrically connected to AF supporting part 14 (lower plate springs 141 and 142). Power-supply input terminals 162c and 162d are electrically connected to AF power-supply lines 171 and 172. Signal input terminals 162e and 162f are electrically connected to AF supporting part 13 (upper plate springs 131 and 132). Each of terminals 162a to 162f is electrically connected to control IC 161 via interconnections 164a to 164f. Bypass capacitor 163 bypasses interconnection 164c (power-supply line) and interconnection 164d (GND line) to reduce change in power-supply voltage.

Control IC 161 functions as a coil control part that controls the energization current through AF coil part 112. Specifically, control IC 161 controls the energization current through AF coil part 112 based on the control signals provided via signal suspension wires 31A and 31B and AF supporting part 13 (AF signal lines) and based on the detection result (Hall output) by built-in Hall element 165 included in control IC 161.

Figure 13:
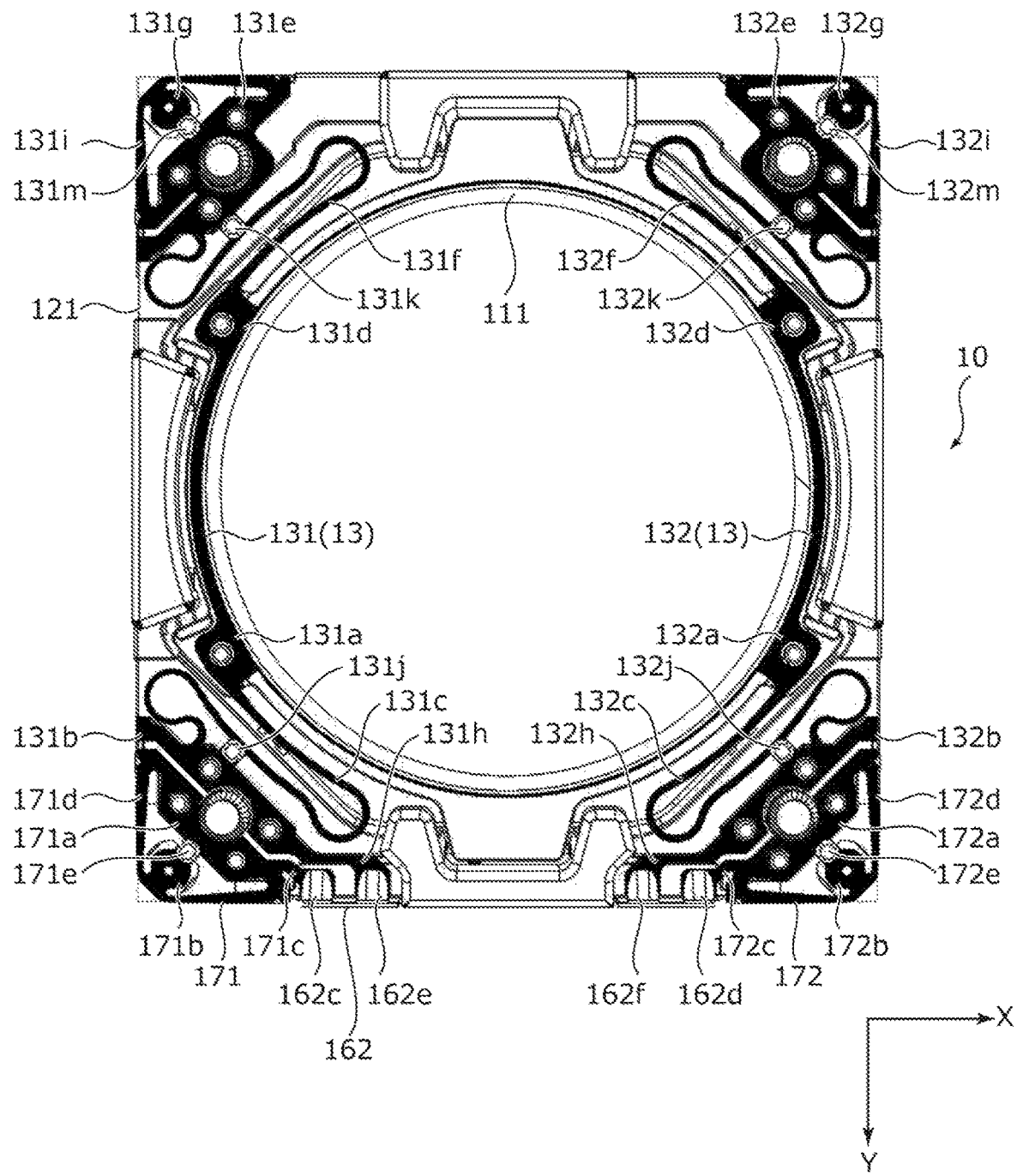
FIG. 13 is a plan view illustrating a configuration of an upper elastic supporting part and AF power-supply lines.

As illustrated in FIGS. 7 and 8, AF supporting part 13 elastically supports AF movable part 11 (lens holder 111) with respect to AF fixing part 12 (magnet holder 121) at the light reception side of AF movable part 10 in the optical-axis direction (AF supporting part 13 may also hereinafter be referred to as "upper elastic supporting part 13"). The configuration of upper elastic supporting part 13 and AF power-supply lines 171 and 172 is illustrated in FIG. 13. FIG. 13 is a plan view of OIS movable part 10. Upper elastic supporting part 13 and AF power-supply lines 171 and 172 are formed, for example, from titanium copper, nickel copper, stainless steel, and/or the like.

As illustrated in FIG. 13, upper elastic supporting part 13 and AF power-supply lines 171 and 172, as a whole, are rectangular in plan view, that is, have the same shape as magnet holder 121. Upper elastic supporting part 13 is composed of two upper plate springs 131 and 132. Upper plate springs 131 and 132 and AF power-supply lines 171 and 172 are disposed so as not to come into contact with one another on magnet holder 121. Upper plate springs 131 and 132 and AF power-supply lines 171 and 172 are formed by performing an etching process on one sheet metal, for example.

Upper plate springs 131 and 132 and AF power-supply lines 171 and 172 are fixed to four corners of magnet holder 121. Bigger currents flow through AF power-supply lines 171 and 172 than currents flowing through upper plate springs 131 and 132 which function as AF signal lines. Accordingly, AF power-supply lines 171 and 172 are disposed nearer to AF control part 16 than upper plate springs 131 and 132 are to AF control part 16, and the path lengths between AF power-supply lines 171 and 172 and AF control part 16 are made shorter. This configuration makes it possible to eliminate the danger of power supply short.

Upper plate spring 131 includes lens-holder fixing portions 131a and 131d to be fixed to lens holder 111, magnet-holder fixing portions 131b and 131e to be fixed to magnet holder 121, and arm portions 131c and 131f coupling lens-holder fixing portions 131a and 131d to magnet-holder fixing portions 131b and 131e. Lens-holder fixing portions 131a and 131d are coupled to each other along lens housing 111a of lens holder 111. Arm portions 131c and 131f have a winding road shape, and elastically deform when AF movable part 11 moves.

Upper plate spring 131 also includes wire connection portion 131g and terminal connection portion 131h. Wire connection portion 131g extends continuously from magnet-holder fixing portion 131e via two link portions 131i extending along the rim of magnet holder 121 from magnet-holder fixing portion 131e toward the corner portion. Terminal connection portion 131h extends from magnet-holder fixing portion 131b toward AF printed wiring board 166.

Similarly, upper plate spring 132 includes lens-holder fixing portions 132a and 132d, magnet-holder fixing portions 132b and 132e, and arm portions 132c and 132f. Lens-holder fixing portions 132a and 132d are coupled to each other along lens housing 111a of lens holder 111. Arm portions 132c and 132f have a winding road shape, and elastically deform when AF movable part 11 moves.

Upper plate spring 132 also includes wire connection portion 132g and terminal connection portion 132h. Wire connection portion 132g extends continuously from magnet-holder fixing portion 132e via two link portions 132i extending along the rim of magnet holder 121 from magnet-holder fixing portion 132e toward the corner portion. Terminal connection portion 132h extends from magnet-holder fixing portion 132b toward AF printed wiring board 166.

Upper plate springs 131 and 132 are positioned with respect to lens holder 111 and fixed thereto by fitting positioning bosses (whose reference numerals are omitted) of upper-spring fixing portions 111d of lens holder 111 in fixing holes (whose reference numerals are omitted) of lens-holder fixing portions 131a, 131d, 132a, and 132d. Upper plate springs 131 and 132 are also positioned with respect to magnet holder 121 and fixed thereto by fitting positioning bosses (whose reference numerals are omitted) of upper-spring fixing portions 121g of magnet holder 121 in fixing holes (whose reference numerals are omitted) of magnet-holder fixing portions 131b, 131e, 132b, and 132e.

Wire connection portions 131g and 132g are soldered to and electrically connected to signal suspension wires 31A and 31B (see FIGS. 5 and 6). Terminal connection portions 131h and 132h are soldered to and electrically connected to signal input terminals 162e and 162f of AF printed wiring board 166. Upper plate springs 131 and 132 function as AF signal lines adapted to provide AF control part 16 (control IC 161) with the control signal from signal suspension wires 31A and 31B.

AF power-supply line 171 includes magnet-holder fixing portion 171a, wire connection portion 171b, and terminal connection portion 171c. Wire connection portion 171b extends continuously from magnet-holder fixing portion 171a via two link portions 171d extending along the rim of magnet holder 121 from magnet-holder fixing portion 171a toward the corner portion. Terminal connection portion 171c extends from magnet-holder fixing portion 171a toward AF printed wiring board 166.

Similarly, AF power-supply line 172 includes magnet-holder fixing portion 172a, wire connection portion 172b, and terminal connection portion 172c. Wire connection portion 172b extends continuously from magnet-holder fixing portion 172a via two link portions 172d extending along the rim of magnet holder 121 from magnet-holder fixing portion 172a toward the corner portion. Terminal connection portion 172c extends from magnet-holder fixing portion 172a toward AF printed wiring board 166.

AF power-supply lines 171 and 172 are positioned with respect to magnet holder 121 and fixed thereto by fitting positioning bosses (whose reference numerals are omitted) of upper-spring fixing portions 121g of magnet holder 121 in fixing holes (whose reference numerals are omitted) of magnet-holder fixing portions 171a and 172a.

Wire connection portions 171b and 172b are soldered to and electrically connected to power-supplying suspension wires 32A and 32B (see FIGS. 5 and 6). Terminal connection portions 171c and 172c are soldered to and electrically connected to power-supply input terminals 162c and 162d of AF printed wiring board 166. AF power-supply lines 171 and 172 supply electricity from power-supplying suspension wires 32B and 32A to AF control part 16 (control IC 161).

Here, it is preferable that the solder used for electric connection does not contain flux. With such solder, it is made unnecessary to clean flux after soldering, so that it is possible to use the PAR or PAR alloy with poor solvent resistance as the molding material of lens holder 111 and/or magnet holder 121.

Although link portions 131i, 132i, 171d, and 172d extend from magnet-holder fixing portions 131e, 132e, 171a, and 172a toward the corner portions of upper plate springs 131 and 132 and AF power-supply lines 171 and 172, pairs of link portions 131i, 132i, 171d, and 172d each may include a portion extending inward from a confluent portion (corner portion) and wire connection portions 131g, 132g, 171b, and 172b may be disposed at the tip ends of such inward extension portions. That is, link portions 131i, 132i, 171d, and 172d interposed between magnet-holder fixing portions 131e, 132e, 171a, and 172a and wire connection portions 131g, 132g, 171b, and 172b may be multi-articulated while securing the linkage length. With this configuration, stresses caused in link portions 131i, 132i, 171d, and 172d during shake-correcting are mitigated, so that the tilt characteristics improve and also the resistance to impact such as drop impact or the like improves.

In upper plate springs 131 and 132, damper materials 131j, 131k, 132j, and 132k are provided between magnet-holder fixing portions 131b, 131e, 132b, and 132e and arm portions 131c, 131f, 132c, and 132f. These damper materials 131j, 131k, 132j, and 132k reduce excessive motions of arm portions 131c, 131f, 132c, and 132f during movement of lens holder 111 in the optical-axis direction, so that it is possible to prevent interference between upper plate springs 131 and 132 and other members. Therefore, the stability of operation improves.

In upper plate springs 131 and 132, damper materials 131m and 132m are provided between magnet-holder fixing portions 131e and 132e and wire connection portions 131g and 132g. Also in AF power-supply lines 171 and 172, damper materials 171e and 172e are provided between magnet-holder fixing portions 171a and 172a and wire connection portions 171b and 172b. Accordingly, generation of unwanted resonance (high-order resonant mode) is reduced, so that the stability of operation improves.

A cold-setting elastic adhesive based on silyl-group polymer can, for example, be applied as damper materials 131j, 131k, 131m, 132j, 132k, 132m, 171e, and 172e, and damper materials 131j, 131k, 131m, 132j, 132k, 132m, 171e, and 172e can be easily applied, for example, using a dispenser.

Note that, although upper plate springs 131 and 132 are used to function as the AF signal lines and AF power-supply lines 171 and 172 are provided separately from upper plate springs 131 and 132, upper plate springs 131 and 132 may be made to function as the AF power-supply lines and the AF signal lines may be provided separately from upper plate springs 131 and 132.

Figure 14:
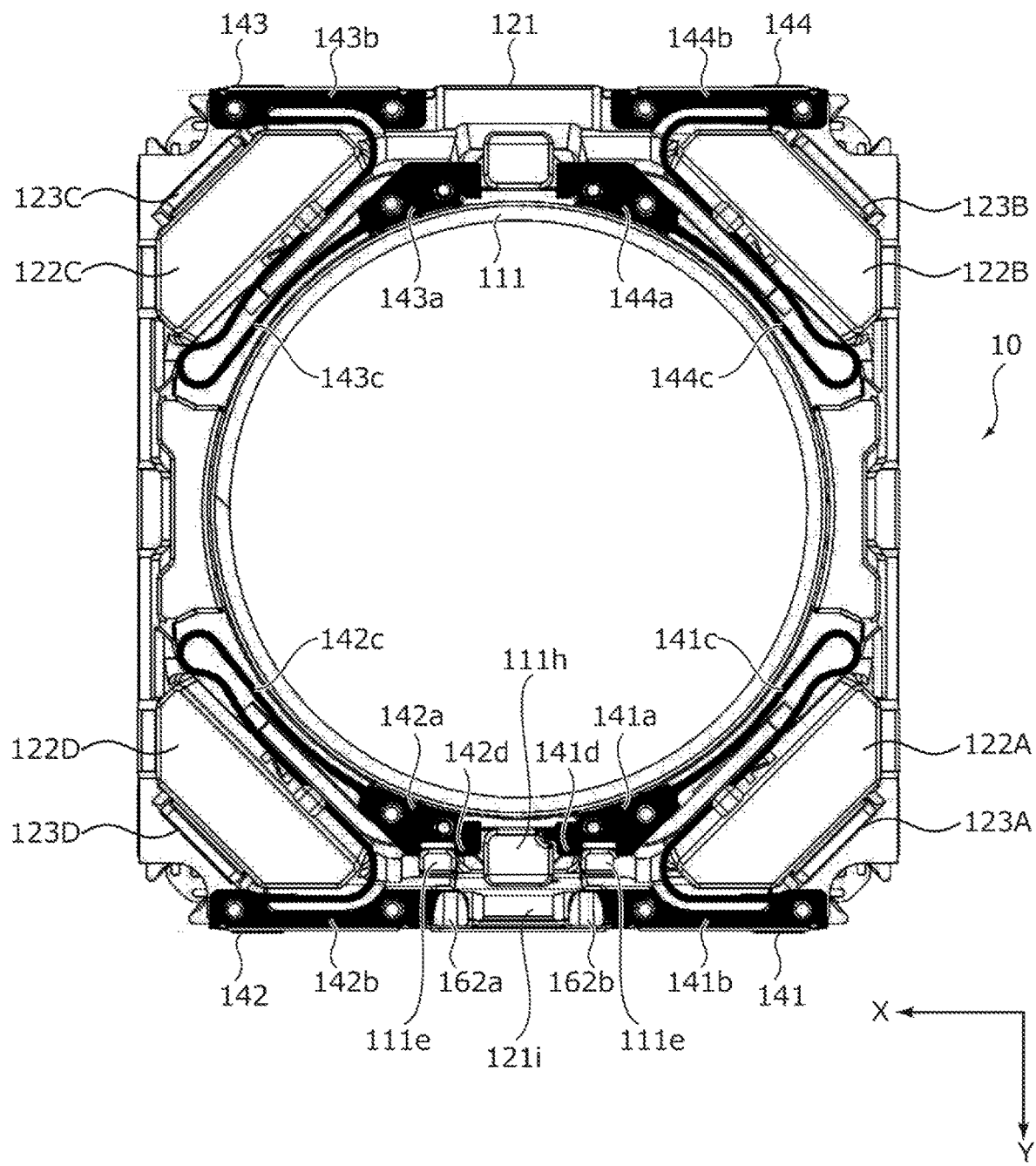
FIG. 14 illustrates a configuration of a lower elastic supporting part.

As illustrated in FIGS. 7 and 8, AF supporting part 14 elastically supports AF movable part 11 (lens holder 111) with respect to AF fixing part 12 (magnet holder 121) at the image formation side of AF movable part 10 in the optical-axis direction (AF supporting part 14 may also hereinafter be referred to as "lower elastic supporting part 14"). The configuration of lower elastic supporting part 14 is illustrated in FIG. 14. FIG. 14 is a bottom view of OIS movable part 10. Like upper elastic supporting part 13, lower elastic supporting part 14 is formed, for example, from titanium copper, nickel copper, stainless steel, and/or the like.

Lower elastic supporting part 14 is composed of four lower plate springs 141 to 144. Lower plate springs 141 to 144 are formed by performing an etching process on one sheet metal, for example.

Lower plate springs 141 to 144 have substantially the same shape as one another. Lower plate springs 141 to 144 include lens-holder fixing portions 141a to 144a to be fixed to lens holder 111, magnet-holder fixing portions 141b to 144b to be fixed to magnet holder 121, and arm portions 141c to 144c coupling lens-holder fixing portions 141a to 144a to magnet-holder fixing portions 141b and 144b.

Arm portions 141c to 144c each include a winding path shape which curves along with the outer edge of each of permanent magnets 122A to 122D, and each elastically deform when AF movable part 11 moves. Arm portions 141c to 144c are formed in such a manner as to extend along the outer edges of permanent magnets 122A to 122D, and are arranged on the light reception side relative to the undersurfaces of permanent magnets 122A to 122D in the optical-axis direction at the neutral point. In other words, permanent magnets 122A to 122D protrude toward the image formation side relative to lower plate springs 141 to 144 in the optical-axis direction.

Additionally, lower plate springs 141 and 142 which are disposed on the side of AF control part 16 in the Y direction include coil connection portions 141d and 142d and terminal connection portions 141e and 142e. Coil connection portions 141d and 142d extend continuously from lens-holder fixing portions 141a and 142a. Terminal connection portions 141e and 142e extend from magnet-holder fixing portions 141b and 142b toward AF printed wiring board 166.

Lower plate springs 141 to 144 are positioned with respect to lens holder 111 and fixed thereto by fitting positioning bosses of lower-spring fixing portions 111g of lens holder 111 in fixing holes of lens-holder fixing portions 141a to 144a. Lower plate springs 141 to 144 are also positioned with respect to magnet holder 121 and fixed thereto by fitting positioning bosses of lower-spring fixing portion 121g in fixing holes of magnet-holder fixing portions 141b to 144b.

Coil connection portions 141d and 142d are soldered to and electrically connected to AF coil part 112 tied to tying parts 111e of lens holder 111. Terminal connection portions 141e and 142e are soldered to and electrically connected to power-supply output terminals 162a and 162b of AF printed wiring board 166. As describe above, it is preferable that the solder used for electric connection does not contain flux. Lower plate springs 141 and 142 function as coil power-supply lines which supply electricity from control IC 161 to AF coil part 112.

Figure 15:
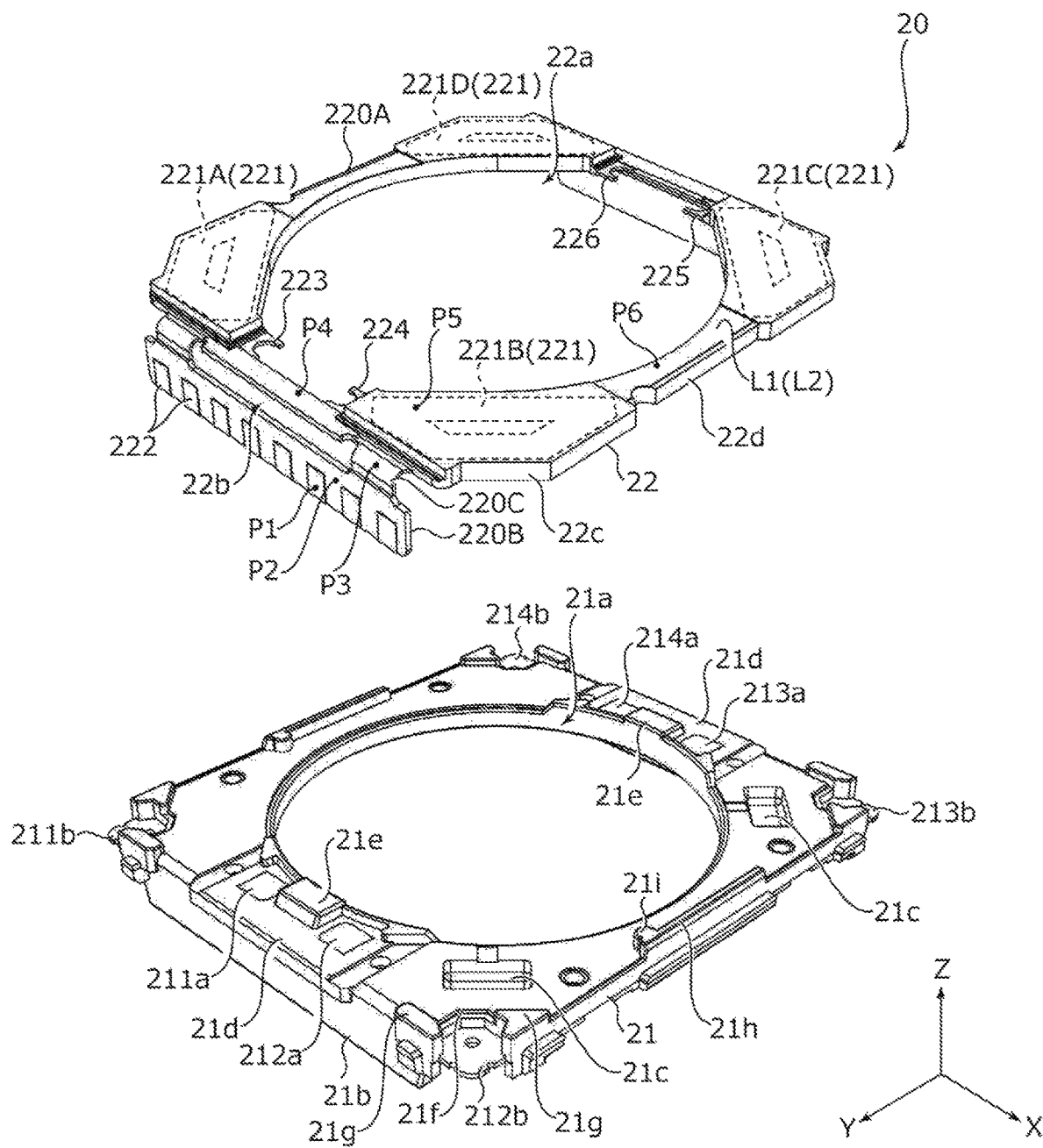
FIG. 15 is an exploded perspective view of an OIS fixing part.
Figure 16:
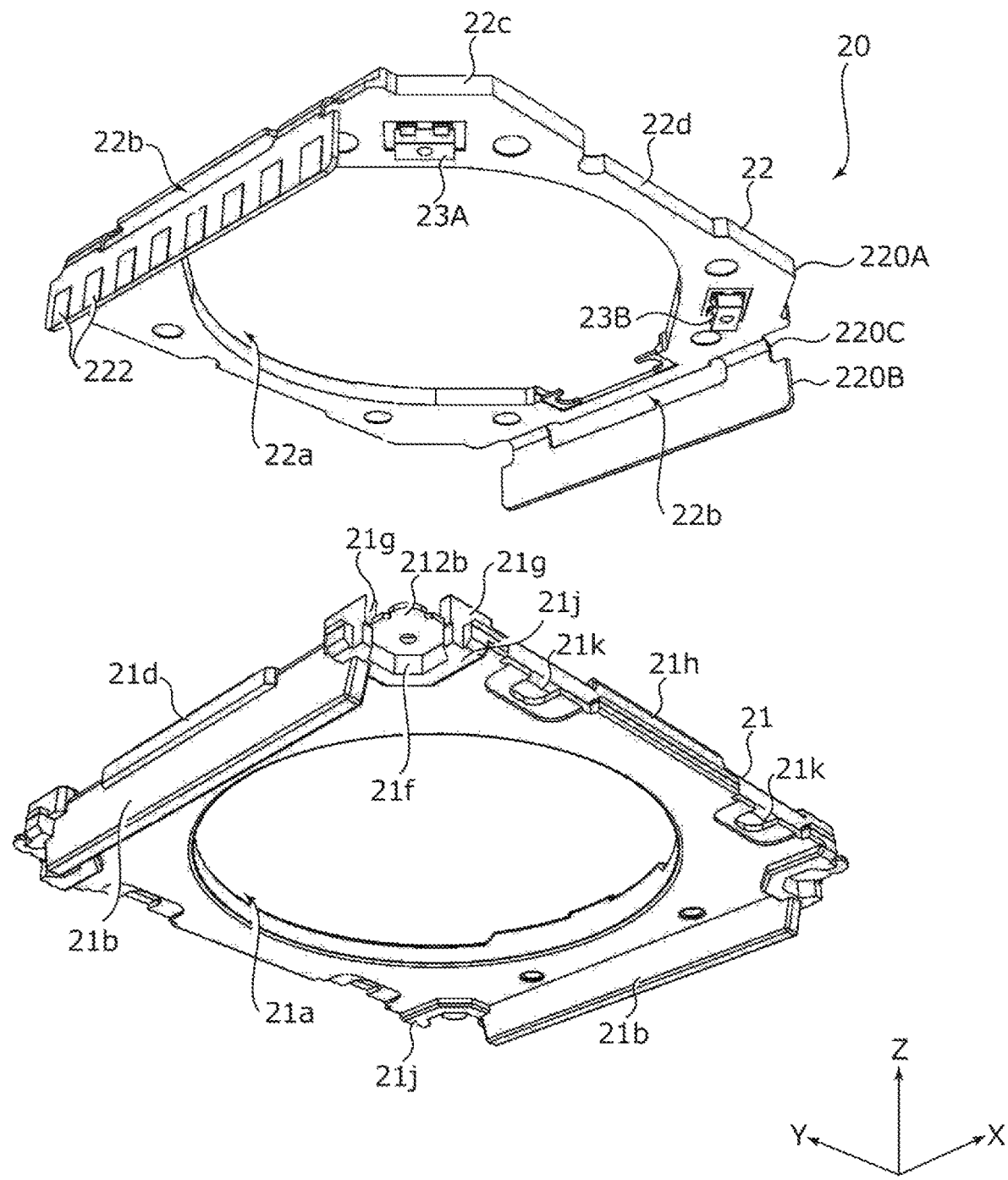
FIG. 16 is an exploded perspective view of the OIS fixing part.

FIGS. 15 and 16 are exploded perspective views of OIS fixing part 20. FIG. 15 is an upper perspective view and FIG. 16 is a lower perspective view.

As illustrated in FIGS. 15 and 16, OIS fixing part 20 includes base 21, coil board 22, XY-position detecting parts 23A and 23B, and the like.

XY-position detecting parts 23A and 23B are Hall elements that utilize the Hall effect to detect change in magnetic field (hereinafter, XY-position detecting parts 23A and 23B may also be referred to as "Hall elements 23A and 23B"). Hall elements 23A and 23B are mounted on the back surface of coil board 22. Here, Hall elements 23A and 23B are disposed at positions corresponding to OIS coils 221B and 221C. When OIS movable part 10 sways in the optical-axisorthogonal plane, the magnetic field by magnet part 122 changes. Hall elements 23A and 23B detects this change in magnetic field, and accordingly, the position of OIS movable part 10 in the optical-axis-orthogonal plane is detected. The layouts of Hall elements 23A and 23B and magnet part 122 are designed such that the magnetic fluxes proportional to the movement amount of OIS movable part 10 cross the detection surfaces of Hall elements 23A and 23B. Accordingly, it is made possible to obtain the Hall outputs proportional to the movement amount of OIS movable part 10. Note that, another magnet for XY-position detection may also be disposed to OIS movable part 10 in addition to magnet part 122.

Figure 17A:
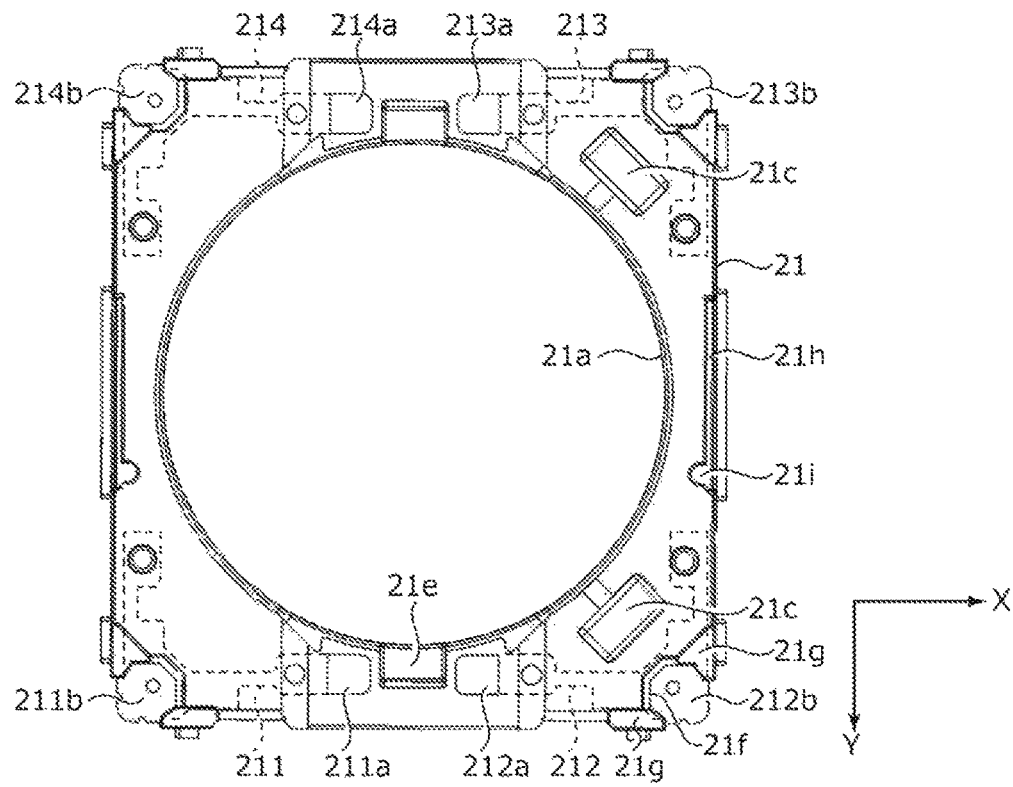
FIGS. 17A and 17B illustrate a configuration of a base.
Figure 17B:
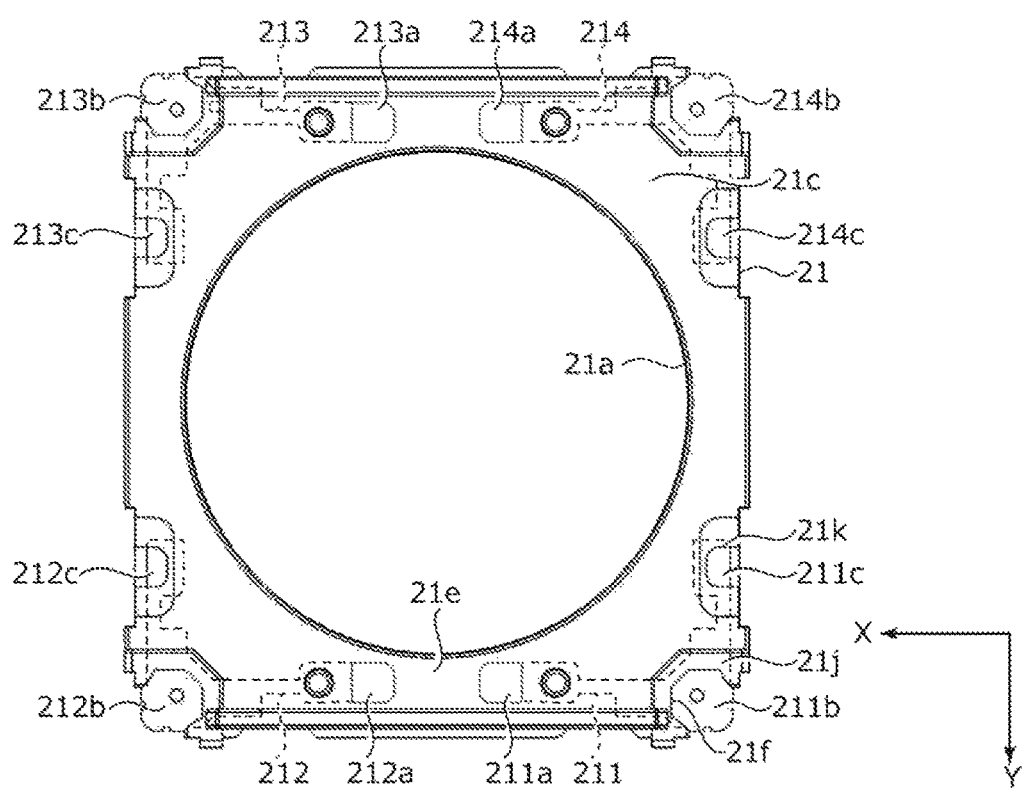

Base 21 is a supporting member adapted to support coil board 22. FIG. 17A is a plan view of base 21 and FIG. 17B is a bottom view of base 21. In FIGS. 17A and 17B, the inside of base 21 is shown transparently.

Base 21 is a rectangular member in plan view, and includes circular opening 21a at the center of base 21. Base 21 includes, at its rim portion, terminal attachment portions 21b at positions corresponding to terminal portions 220B of coil board 22.

Base 21 includes, at the rim portion of opening 21a, Hall-element housings 21c adapted to house Hall elements 23A and 23B. Base 21 also includes terminal housings 21d adapted to house power-supplying terminals 223 and 224 and signal terminals 225 and 226 of coil board 22. Terminal housings 21d are formed to protrude radially outward beyond terminal attachment portion 21b.

Base 21 includes notches 21f at the four corners of the rim portion of base 21. Base 21 includes, on its upper surface, first reinforcing ribs 21g at the rims of notches 21f and also includes second reinforcing ribs 21h at the rim of base 21 along the Y direction. Base 21 also includes, on its undersurface, third reinforcing ribs 21j at the rims of notches 21f. Second reinforcing ribs 21h each include protrusion 21i used for determining the placing direction of coil board 22. Reinforcing ribs 21g, 21h, and 21j increase the mechanical strength of base 21, thus making it possible to achieve the thickness reduction of base 21. In particular, since base 21 includes second reinforcing ribs 21h extending along the rim portion, base 12 can have a structure robust against distortion.

Base 21 also includes, on its undersurface, adhesive-fixing portions 21k at portions of the rim of base 21 extending along the Y direction. When cover 2 is attached to base 21, an adhesive (for example, epoxy resin) is applied to adhesive-fixing portions 21k.

Base 21 includes four embedded terminal metal fixtures 211 to 214. Terminal metal fixtures 211 to 214 are formed integrally with base 21, for example, by insert molding. Terminal metal fixtures 211 to 214 are each L-shaped and disposed along the four corners of base 21. One ends 211a to 214a of terminal metal fixtures 211 to 214 are exposed from terminal housings 21d of base 21.

Intermediate portions (bent portions) 211b to 214b of terminal metal fixtures 211 to 214 are exposed from notches 21f of the four corners of base 21. Intermediate portions 211b to 214b are arranged on the image formation side in the optical-axis direction relative to the surface of base 21 located on the light reception side in the optical-axis direction. One ends of suspension wires 30 are connected to intermediate portions 211b to 214b of terminal metal fixtures 211 to 214. Thus, it is made possible to secure the effective length of suspension wire 30 while achieving the height reduction of lens driving device 1. Accordingly, fracture due to the metal fatigue or the like of suspension wire 30 can be reduced, so that the reliability of lens driving device 1 improves.

Other ends 211c to 214c of terminal metal fixtures 211 to 214 are exposed from adhesive-fixing portions 21k of base 21 and, when cover 2 is attached to base 21, the adhesive is applied to other ends 211c to 214c. The anchor effect increases the adhesive strength for attachment of cover 2 to base 21, thus improving the resistance to drop impact.

Terminal metal fixture 211 is soldered to and electrically connected to power-supplying terminal 223 of coil board 22 and to power-supplying suspension wire 32A. Terminal metal fixture 212 is soldered to and electrically connected to power-supplying terminal 224 of coil board 22 and to power-supplying suspension wire 32B. Terminal metal fixture 213 is soldered to and electrically connected to signal terminal 225 of coil board 22 and to signal suspension wire 31B. Terminal metal fixture 214 is soldered to and electrically connected to signal terminal 226 of coil board 22 and to signal suspension wire 31A.

Base 21 includes protruding portions 21e protruding on the light reception side in the optical-axis direction such that adjacent terminal metal fixtures 211 and 212 are isolated from each other and adjacent terminal metal fixtures 213 and 214 are isolated from each other. Protruding portions 21e are disposed between ends 211a and 212a of terminal metal fixtures 211 and 212 and between ends 213a and 214a of terminal metal fixtures 213 and 214, respectively. Protruding portions 21e spatially separate terminal metal fixtures 211A and 211B from each other and terminal metal fixtures 211C and 211D from each other to secure the insulation property, so as to improve the safety and reliability.

In the embodiments of the present invention, like lens holder 111 and magnet holder 121, base 21 is formed from a molding material consisting of polyarylate (PAR) or a PAR alloy (e.g. PAR/PC) which is a mixture of multiple resin materials including PAR. With this molding material, the weld strength is increased and, thus, the toughness and impact resistance can be secured even when base 21 is thin-walled. It is thus possible to make the external size of lens driving device 1 smaller and to achieve the miniaturization and height reduction.

Additionally, base 21 is preferably formed by injection molding using multiple gates. In this case, the gate diameter is preferably 0.3 mm or greater. Such injection molding brings about a better fluidity during molding, so as to allow thin-wall molding and besides, to make it possible to prevent occurrence of sink marks even when the PAR or PAR alloy is used as molding material.

It is preferable that the molding material consisting of the PAR or PAR alloy be conductive and, in particular, have a volume resistivity of from $10^9$ $\Omega\cdot$cm to $10^{11}$ $\Omega\cdot$cm. For example, it is possible to easily impart conductivity to an existing PAR or PAR alloy by mixing carbon nanotubes into such an existing PAR or PAR alloy. At this time, suitable conductivity can be imparted by adjusting the content of carbon nanotubes. Such adjustment makes it possible to reduce electrification of base 21 and thus to prevent occurrence of static electricity.

Note that, it is preferable that the PAR or PAR alloy as the molding material of base 21 contain fluoride when the movement of AF movable part 11 (lens holder 111) in the optical-axis direction is restricted by lens holder 111 and base 21. By the contained fluoride, the intermolecular forces become weaker, so that the adsorptive power of portions of base 21 coming into contact with lens holder 111 decreases and the slidability improves. Accordingly, it is possible to prevent dust generation due to friction during contact between lens holder 111 and base 21.

Figure 18:
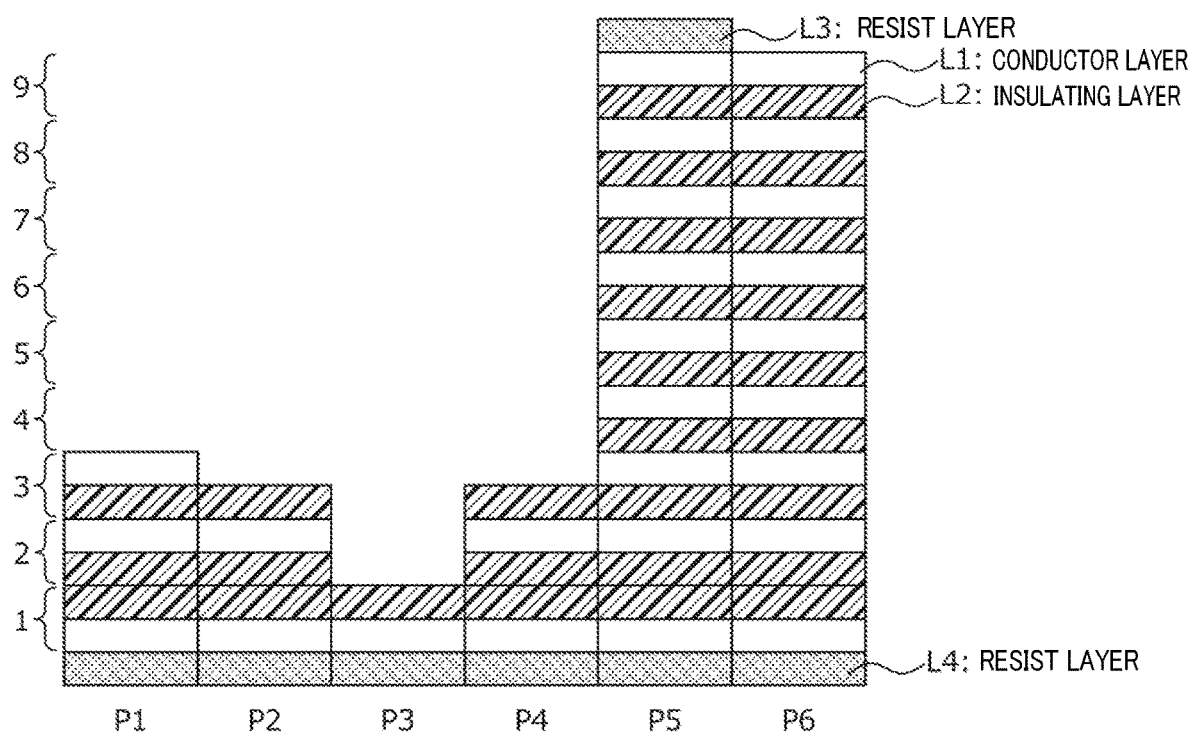
FIG. 18 illustrates a stack structure of a coil board.

As illustrated in FIGS. 15 and 16, coil board 22 is a rectangular board in plan view like base 21 and includes circular opening 22a at the center of coil board 22. Coil board 22 is a multilayer printed wiring board in which multiple unit layers consisting of conductor layer L1 and insulating layer L2 (see FIG. 18) are stacked on one another. In the embodiments of the present invention, OIS coil part 221, external terminals 222, and a conductor pattern (not illustrated) including power-supply lines used for connecting external terminals 222 to OIS coil part 221 are integrally formed in coil board 22. FIG. 18 illustrates layer structures at points P1 to P6 of coil board 22 in FIG. 15.

In coil board 22, conductor layer L1 is formed from a copper foil, for example. Insulating layers L2 is formed from a liquid crystal polymer (LCP), for example. Note that, resist layers L3 and L4 are formed on the front and back surfaces of coil board 22 when necessary.

Coil board 22 includes main board portion 220A, terminal portions 220B, and coupling portions 220C. The number of stacked layers of the first stack structure forming main board portion 220A is greater than that of the second stack structure forming terminal portions 220B, and the number of stacked layers of second stack structure is greater than that of the third stack structure forming coupling portions 220C. In the embodiments of the present invention, main board portion 220A is formed from nine unit layers, terminal portions 220B are each formed from three unit layers, and coupling portions 220C are each formed from one unit layer.

Main board portion 220A includes OIS coil part 221 at a position where OIS coil part 221 faces magnet part 122 in the optical-axis direction. OIS coil part 221 is composed of four OIS coils 221A to 221D corresponding to permanent magnets 122A to 122D. OIS coils 221A to 221D are formed inside main board portion 220A in the manufacturing process of coil board 22. In the embodiments of the present invention, OIS coils 221A to 221D are formed from seven unit layers (layer Nos. 3 to 9) of the nine unit layers of main board portion 220A. The remaining two unit layers (layer Nos. 1 and 2) of main board portion 220A are connection layers in which the conductor pattern including an interconnection connecting OIS coil part 221 and Hall elements 23A and 23B to external terminals 222 is formed.

The sizes and arrangement of OIS coils 221A to 221D and permanent magnets 122A to 122D are set such that the radial edges of permanent magnets 122A to 122D are respectively within the coil sectional widths of OIS coils 221A to 221D, that is, such that the magnetic fields emitted from the bottoms of permanent magnets 122A to 122D cross two opposite sides of OIS coils 221 to 221D and then return to permanent magnets 122A to 122D. Here, OIS coils 221A to 221D each have the same shape as those of permanent magnets 122A to 122D as seen in plan view (in this case, substantially isosceles trapezoid). Thus, it is made possible to generate efficiently the driving force (electromagnetic force) for causing OIS movable part 10 to sway in the optical-axis-orthogonal plane. OIS coils 221A and 221C are connected and the OIS coils 221B and 221D are connected to each other, and two pairs of OIS coils 221A and 221C and of OIS coils 221B and 221D are energized respectively with the same currents. Permanent magnets 122A and 122C and OIS coils 221A and 221C constitute the OIS voice coil motor causing OIS movable part 10 to sway in the U direction. Permanent magnets 122B and 122D and OIS coils 221B and 221D constitute the OIS voice coil motor causing OIS movable part 10 to sway in the V direction.

The corners of main board portion 220A are formed in the shape corresponding to first reinforcing ribs 21g of base 21 (cut portions 22c). Additionally, rim portions 22d extending in the Y direction along main board portion 220A restricts the movement of AF movable part 11 toward the image formation side in the optical-axis direction by coming into contact with holder-side contact portions 111i when AF movable part 11 moves toward the image formation side in the optical-axis direction (hereinafter, these rim portions 22d are referred to as "base-side contact portions 22d"). The side surface of each of base-side contact portions 22d is formed in the shape corresponding to each of second reinforcing ribs 21h of base 21.

Regions of the upper surface (surface on the light reception side in the optical-axis direction) of main board portion 220A where OIS coil part 221 is disposed are covered by resist layer L3. In contrast, resist layer L3 is not formed on other regions of the upper surface corresponding to base-side contact portions 22d (portions coming into contact with AF movable part 11) and conductor layer L1 is exposed on such regions. Note that, insulating layer L2 may also be exposed on the regions of the upper surface corresponding to base-side contact portions 22d. Such a configuration makes it possible to stabilize the attitude of AF movable part 11 when the movement of AF movable part 11 toward the image formation side in the optical-axis direction is restricted. Additionally, it is possible to prevent dust generation due to friction during contact between holder-side contact portion 111i and the upper surface regions of base-side contact portions 22d.

Hall elements 23A and 23B are mounted on the undersurface of main board portion 220A. Main board portion 220A also includes power-supplying terminals 223 and 224 and signal terminals 225 and 226. Power-supplying terminals 223 and 224 and signal terminals 225 and 226 are electrically connected to terminal metal fixtures 211 to 214 (ends 211a to 214a exposed from terminal housings 21d) of base 21 by soldering. OIS coils 221A to 221D, Hall elements 23A and 23B, power-supplying terminals 223 and 224, and signal terminals 225 and 226 are electrically connected to the external terminals 222 of terminal portions 220B via the conductor pattern (not illustrated) formed in coil board 22.

The conductor pattern of coil board 22 includes power-supply lines (two lines (not illustrated)) for supplying electric power to OIS movable part 10 (AF control part 16), power-supply lines (two lines×2 (not illustrated)) for supplying electric power to OIS coils 221A to 221D, power-supply lines (two lines×2 (not illustrated)) for supplying electric power to Hall elements 23A and 23B, signal lines (two lines (not illustrated)) for detection signals output from Hall elements 23A and 23B, and signal lines (two lines (not illustrated)) for control signals used for controlling the automatic focusing operation in OIS movable part 10.

Terminal portions 220B are provided to face each other in the Y direction. Terminal portions 220B each include eight external terminals 222 and the total number of external terminals amounts to 16. External terminals 222 include power-supplying terminals (two terminals) for AF control part 16, signal terminals (two terminals) for AF control part 16, power-supplying terminals (four terminals) for OIS coil part 221, power-supplying terminals (four terminals) and signal terminals (four terminals) for Hall elements 23A and 23B.

Coupling portions 220C couple main board portion 220A and terminal portions 220B to each other. Coupling portions 220C are each rounded such that each of terminal portions 220B is hung from main board portion 220A. Terminal portions 220B extend substantially perpendicular to main board portion 220A, accordingly. Each of coupling portions 220C also includes opening 22*b* in the approximate middle in the X direction.

In the embodiments of the present invention, the number of stacked layers of coupling portions 220C is smaller than those of main board portion 220A and terminal portions 220B. Thus, it is made possible to relatively easily bend and round coupling portions 220C.

OIS fixing part 20 is assembled by adhering main board portion 220A and terminal portions 220B of coil board 22 to base 21. At this time, cut portions 22*c* of coil board 22 are engaged with first reinforcing ribs 21*g* of base 21. Additionally, base-side contact portions 22*d* of coil board 22 are engaged with second reinforcing ribs 21*h* and protrusions 21*i* formed to second reinforcing ribs 21*h* of base 21. Additionally, the side portions of terminal housings 21*d* of base 21 are engaged with openings 22*b* in coil board 22. With this configuration, coil board 22 is accurately positioned and firmly fixed with respect to base 21.

In the embodiments of the present invention, base 21 and coil board 22 are adhered to each other with an elastic epoxy resin material. Base 21 and coil board 22 are adhesively integrated, so that the mechanical strength of OIS fixing part 20 is increased. It is thus made possible to achieve thin-walled base 21 and/or coil board 22 while securing a desired resistance to drop impact.

Figure 19A:
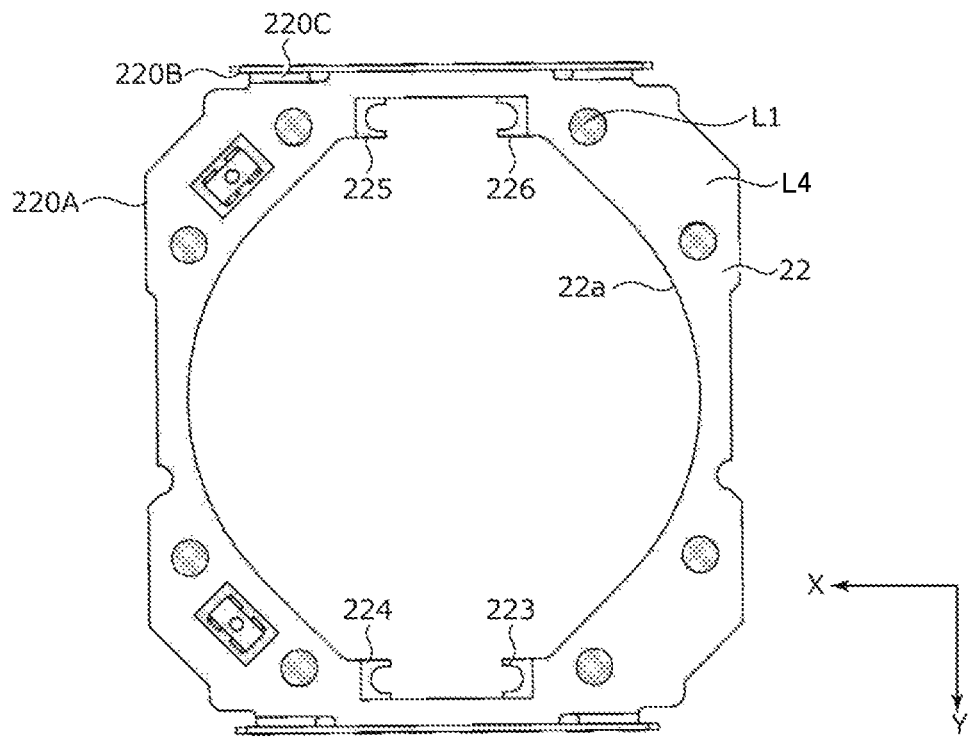
FIGS. 19A and 19B are bottom views illustrating a structure of the coil board.

It is preferable that the back surface of main board portion 220A (surface on the image formation side in the optical-axis direction) be covered with resist layer L4 and conductor layer L1 be exposed from parts of resist layer L4 as illustrated in FIG. 19A. This configuration increases the adhesive strength between base 21 and coil board 22 so as to make it possible to make the structure of OIS fixing part 20 robust.

Figure 19B:
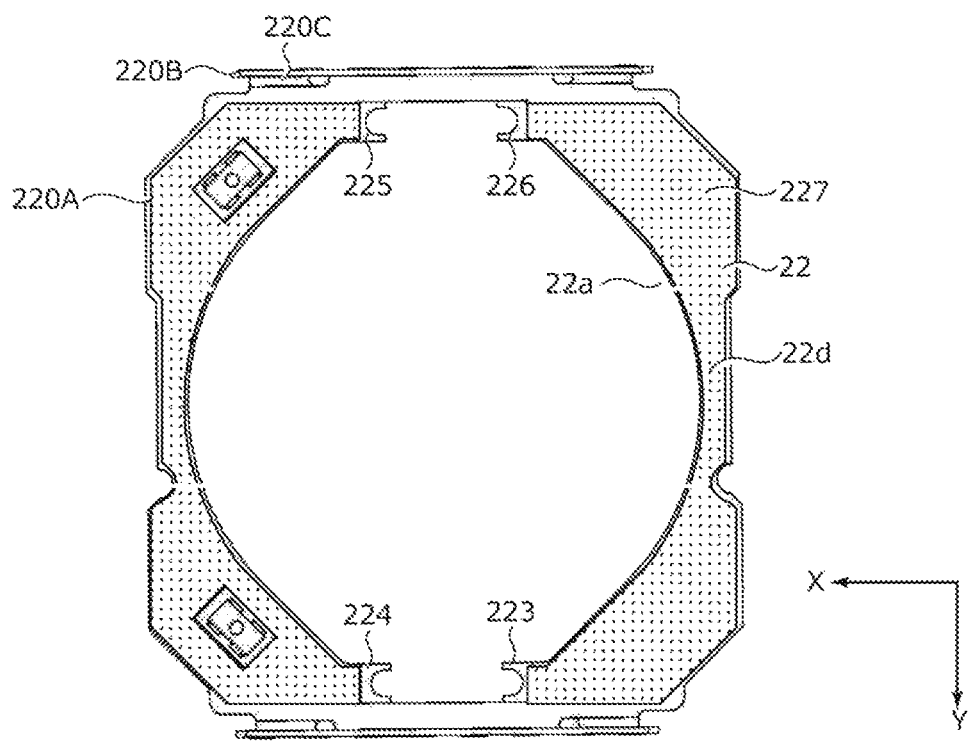

Alternatively, as illustrated in FIG. 19B, the back surface of main board portion 220A may also be covered with magnetic plating layer 227. Magnetic plating layer 227 is a plate member obtained by plating a NiCu plate having a thickness of 30 μm to 50 μm with Ni (5 μm to 10 μm), for example. With this magnetic plating layer 227, OIS fixing part 20 can have a robust structure and the magnetic flux crossing OIS coil part 221 increases, so that the thrust for shake-correcting operation can be increased.

In lens driving device 1, one ends of signal suspension wires 31A and 31B are electrically connected to wire connection portions 131*g* and 132*g* of upper plate springs 131 and 132, respectively. The other ends of signal suspension wires 31A and 31B are electrically connected to terminal metal fixtures 214 and 213 (portions 214*b* and 213*b* exposed from notches 21*f*) of base 21. Terminal metal fixtures 214 and 213 of base 21 are also electrically connected to signal terminals 226 and 225 of coil board 22.

Additionally, one ends of power-supplying suspension wires 32A and 32B are electrically connected to wire connection portions 171*b* and 172*b* of AF power-supply lines 171 and 172, respectively. The other ends of power-supplying suspension wires 32A and 32B are electrically connected to terminal metal fixtures 211 and 212 (portions 211*b* and 212*b* exposed from notches 21*f*) of base 21. Terminal metal fixtures 211 and 212 of base 21 are also electrically connected to power-supplying terminals 223 and 224 of coil board 22.

Figure 20:
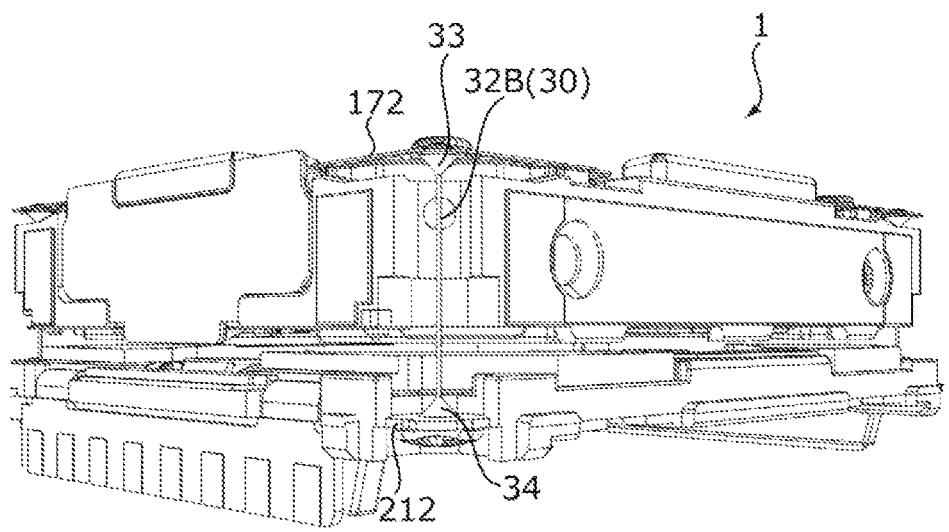
FIG. 20 illustrates a supporting structure of the OIS fixing part and the OIS movable part.
Figure 20:
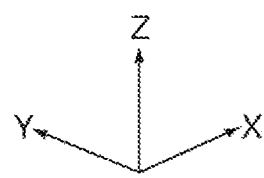

Damper materials 33 and 34 are disposed to portions in which signal suspension wires 31A and 31B are connected to upper plate springs 131 and 132 and terminal metal fixtures 214 and 213, and are also disposed to portions in which power-supplying suspension wires 32A and 32B are connected to AF power-supply lines 171 and 172 and terminal metal fixtures 211 and 212. That is, damper materials 33 and 34 are disposed to the fixed ends of signal suspension wires 31A and 31B and of power-supplying suspension wires 32A and 32B (see FIG. 20). Specifically, damper materials 33 are disposed in such a manner as to surround signal suspension wires 31A and 31B and power-supplying suspension wires 32A and 32B on the undersurfaces (surfaces on the image formation side in the optical-axis direction) of upper plate springs 131 and 132 and of AF power-supply lines 171 and 172. Additionally, damper materials 34 are disposed in such a manner as to surround signal suspension wires 31A and 31B and power-supplying suspension wires 32A and 32B on the upper surfaces (surfaces on the light reception side in the optical-axis direction) of terminal metal fixtures 214, 213, 211, and 212. Damper materials 33 and 34 are disposed. These damper materials 33 and 34 distribute the stress which would arise in each of signal suspension wires 31A and 31B. Accordingly, fracture due to the metal fatigue or the like of suspension wire 30 can be reduced, so that the reliability of lens driving device 1 improves.

In lens driving device 1, a control signal is supplied to AF control part 16 from coil board 22 via base 21, signal suspension wires 31A and 31B, and upper plate springs 131 and 132. Additionally, electricity is supplied to AF control part 16 from coil board 22 via base 21, power-supplying suspension wires 31A and 32B, and AF power-supply lines 171 and 172. Moreover, electricity is supplied to AF coil part 112 from AF control part 16 via lower plate springs 141 and 142. In this way, the operational control of AF movable part 11 (specifically, control of the energization current flowing through AF coil part 112) is implemented.

Since control IC 161 of AF control part 16 includes Hall element 165 and the coil control part, and the closed-loop control based on the detection result of Hall element 165 is completed in AF control part 16, it is enough only to supply electricity and the control signal to AF control part 16 by four suspension wires 31A, 31B, 32A, and 32B. Accordingly, the configurations of suspension wires 30 used for driving AF coil part 112 and Hall element 165 can be simplified and the reliability of the AF driving part can be improved.

Additionally, the terminals to be disposed on AF printed wiring board 166 in which control IC 161 is mounted are arranged distributedly, so that the number of degrees of design freedom increases in comparison with the case where the wiring lines (AF power-supply lines, AF signal lines, and coil power-supply lines) are routed together on the light reception side or on the image formation side of lens driving device 1 in the optical-axis direction. Additionally, the soldering area can be enlarged and, it is thus made possible to prevent a faulty connection and to improve reliability.

When the shake correction is performed in lens driving device 1, OIS coils 221A to 221D are energized. Specifically, the energization currents through OIS coils 221A to 221D are controlled by the OIS driving part based on the detection signal from a shake detection part (not illustrated) (for example, a gyro sensor) such that the shake of camera module A can be canceled. At this time, by feedback of the detection result of Hall elements 23A and 23B, it is made possible to accurately control the sway of OIS movable part 10.

When OIS coils 221A to 221D are energized, the Lorentz forces arise at OIS coils 221A to 221D by interaction between the magnetic fields of permanent magnets 122A to 122D and the currents flowing through OIS coils 221A to 221D (Fleming's left hand rule). The directions of the Lorentz forces are directions (the V or U direction) orthogonal both to the direction of the magnetic fields (Z direction) at the long side portions of OIS coils 221A to 221D and to the directions of currents (the U or V direction). Since OIS coils 221A to 221D are fixed, reactive forces act on permanent magnets 122A to 122D. With these reactive forces serving as the driving forces of the OIS voice coil motor, OIS movable part 10 including magnet part 122 sways in the XY plane, so that the shake correction is performed.

When automatic focusing is performed in lens driving device 1, AF coil part 112 is energized. The energization current through AF coil part 112 is controlled by AF control part 16 (control IC 161). Specifically, control IC 161 controls the energization current to AF coil part 112 based on the control signals provided via signal suspension wires 31A and 31B and upper plate springs 131 and 132 and based on the detection result by built-in Hall element 165 included in control IC 161.

Note that, in an non-energization state where automatic focusing is not being performed, AF movable part 11 is brought into a state (neutral point) where AF movable part 11 is suspended between an infinity position and a macro position by upper plate springs 131 and 132 and lower plate springs 141 to 144. That is, in OIS movable part 10, AF movable part 11 (lens holder 111) is elastically supported to be displaceable on both sides in the Z direction while being positioned with respect to AF fixing part 12 (magnet holder 121) by upper plate springs 131 and 132 and lower plate springs 141 to 144.

When AF coil part 112 is energized, the Lorentz force arises at AF coil part 112 by interaction between the magnetic field of magnet part 122 and the current flowing through AF coil 112 part. The direction of the Lorentz force is the direction (the Z direction) orthogonal to the direction of the magnetic field (U or V direction) and to the direction of current flowing through AF coil part 112 (V or U direction). Since magnet part 122 is fixed, a reactive force acts on AF coil part 112. With this reactive force serving as the driving force of the AF voice coil motor, AF movable part 11 including AF coil part 112 moves in the optical-axis direction, so that focusing is performed.

In AF control part 16 of lens driving device 1, the closed loop control is performed based on the detection signal obtained by built-in Hall element 165 included in control IC 161. With the closed-loop control system, it is unnecessary to take into consideration the hysteresis characteristics of the voice coil motor, and it is made possible to directly detect that the position of AF movable part 11 is stabilized. Moreover, the present invention is also applicable to automatic focusing of an image surface detection system. Thus, since the response performance is high, higher-speed automatic focusing operation can be achieved.

As described above, lens driving device 1 includes the AF driving part including AF coil part 112 to be disposed at the periphery of the lens part (not illustrated), magnet part 122 (AF magnet part) to be disposed to be radially spaced apart from AF coil part 112, and AF supporting parts 13 and 14 configured to support, with respect to AF fixing part 12 including magnet part 122, AF movable part 11 including AF coil part 11 such that AF movable part 11 is movable in the optical-axis direction. The AF driving part is configured to perform automatic focusing by utilizing the driving force of the voice coil motor composed of AF coil part 112 and magnet part 122. Lens driving device 1 also includes the OIS driving part including magnet part 122 (shake-correcting magnet part) to be disposed in the AF driving part, OIS coil part 221 to be disposed to be spaced apart from magnet part 122 in the optical-axis direction, and OIS supporting part 30 configured to support, with respect to OIS fixing part 20 including OIS coil part 221, OIS movable part 10 including magnet part 122 such that OIS movable part 10 is able to sway in the optical-axis-orthogonal plane. OIS supporting part 30 is configured to perform shake correction by utilizing the driving force of the voice coil motor composed of OIS coil part 221 and magnet part 122.

In lens driving device 1, AF supporting parts 13 and 14 include upper elastic supporting part 13 configured to couple AF movable part 11 and AF fixing part 12 together at the light reception side in the optical-axis direction, and lower elastic supporting part 14 configured to couple AF movable part 11 and AF fixing part 12 together at the image formation side in the optical-axis direction. OIS supporting part 30 includes: a pair of power-supplying suspension wires 32A and 32B including one ends to be connected to AF fixing part 12 and the other ends to be connected to OIS fixing part 20; and a pair of signal suspension wires 31A and 31B including one ends to be connected to AF fixing part 12 and the other ends to be connected to OIS fixing part 20. AF movable part 11 includes: lens holder 111 including cylindrical lens housing 111a configured to hold the lens part and the coil winding portion on which AF coil part 112 is wound; and first position-detecting magnet 15A (position-detecting magnet) to be disposed to lens holder 111. The AF fixing part is electrically connected to power-supplying suspension wires 32A and 32B and to signal suspension wires 31A and 31B, and includes AF control part 16 configured to control the energization current through AF coil part 112. The AF driving part includes a pair of AF power-supply lines 171 and 172 to be connected to the pair of power-supplying suspension wires 32A and 32B, a pair of signal lines to be connected to the pair of signal suspension wires 31A and 31B, and a coil power-supply line configured to electrically connect the AF control part to AF coil part 112. AF control part 16 includes: control IC 161 including built-in Hall element 165 and the built-in coil control part configured to control the energization current through AF coil part 112 based on the control signal provided via signal suspension wires 31A and 31B and based on the detection result of Hall element 165; and AF printed wiring board 166 on which control IC 161 is mounted. Upper elastic supporting part 13 (upper plate springs 131 and 132) functions as the signal lines, and the lower elastic supporting part (lower plate springs 141 and 142) functions as the coil power-supply lines. Note that, upper elastic supporting part 13 may also function as the AF power-supply lines, and an AF signal line may also be provided separately from upper elastic supporting part 13.

Additionally, in lens driving device 1, AF fixing part 12 includes Hall element 165 that detects the position of AF movable part 11 in the optical-axis direction. AF movable part 11 includes first position-detecting magnet 15A (position-detecting magnet) arranged near Hall element 165. Both of magnet part 122 and first position-detecting magnet 15A are radially magnetized.

Additionally, in lens driving device 1, OIS fixing part 20 includes coil board 22 consisting of the multilayer printed wiring board in which multiple unit layers consisting of conductor layer L1 and insulating layer L2 are stacked on one another, and base 21 on which coil board 22 is placed. OIS coil part 221, external terminals 222, and the conductor pattern (not illustrated) including the power-supply lines used for connecting external terminals 222 to OIS coil part 221 are integrally formed in coil board 22.

Additionally, in lens driving device 1, AF movable part 11 includes lens holder 111 adapted to hold the lens part and AF coil part 112, AF fixing part 12 includes magnet holder 121 adapted to hold magnet part 122 (AF magnet part), and OIS fixing part 20 includes base 21 to which OIS coil part 221 is disposed. Lens holder 111, magnet holder 121, and base 21 are formed from a molding material consisting of polyarylate (PAR) or a PAR alloy which is a mixture of multiple resin materials including polyarylate. Note that, at least one of lens holder 111, magnet holder 121, and bases 21 may be formed from the molding material consisting of the PAR or PAR alloy.

According to lens driving device 1, it is possible to achieve the miniaturization and weight reduction and also to improve the reliability.

While the invention made by the present inventor has been specifically described based on the preferred embodiments, it is not intended to limit the present invention to the above-mentioned preferred embodiments but the present invention may be further modified within the scope and spirit of the invention defined by the appended claims.

For example, although the embodiments of the present invention have been described in relation to the case where one control IC 161 includes built-in Hall element 165 and the built-in coil control part (not illustrated), Hall element 165 and the coil control part may be mounted, as separate ICs, on AF printed wiring board 166.

Additionally, by way of another example, the AF signal lines and AF power-supply lines disposed in the AF driving part may be provided separately from upper elastic supporting part 13. However, since this modification results in a complicated structure, it is preferable that upper elastic supporting part 13 function as the AF signal lines or the AF power-supply line.

While smartphone M serving as a camera-equipped mobile terminal has been described in the embodiments as an example of the camera-mounted device including camera module A, the present invention is applicable to a camera-mounted device serving as an information device or a transporting device. The camera-mounted device serving as an information device is an information device including a camera module and a control section that processes image information obtained with the camera module, and examples of such a camera-mounted device include a camera-equipped mobile phone, a note-type personal computer, a tablet terminal, a mobile game machine, a web camera, and a camera-equipped in-vehicle apparatus (for example, a rear-view monitor apparatus or a drive recorder apparatus). In addition, the camera-mounted device serving as a transporting device is a transporting device including a camera module and a control part that processes an image obtained with the camera module, and examples of such a camera-mounted device include an automobile.

Figure 21A:
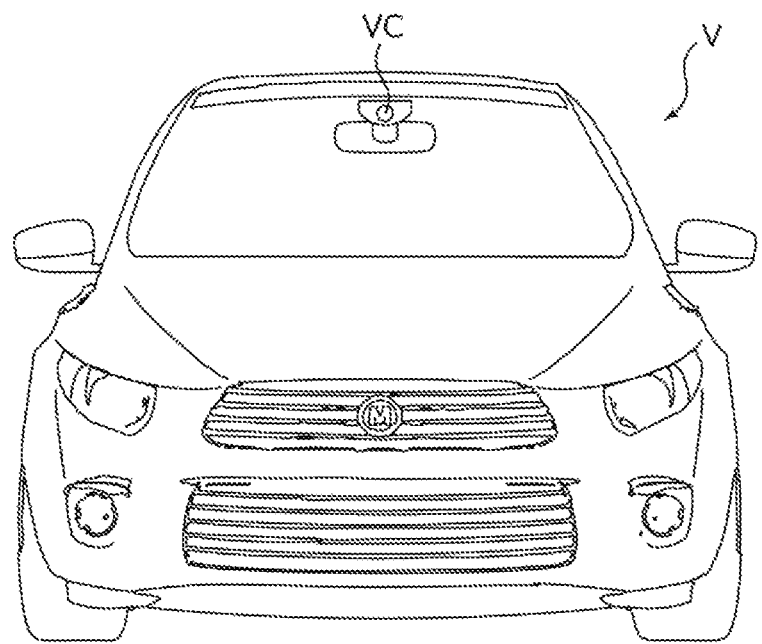
FIGS. 21A and 21B illustrate an automobile as a camera-mounted device in which an in-vehicle camera module is mounted.
Figure 21B:
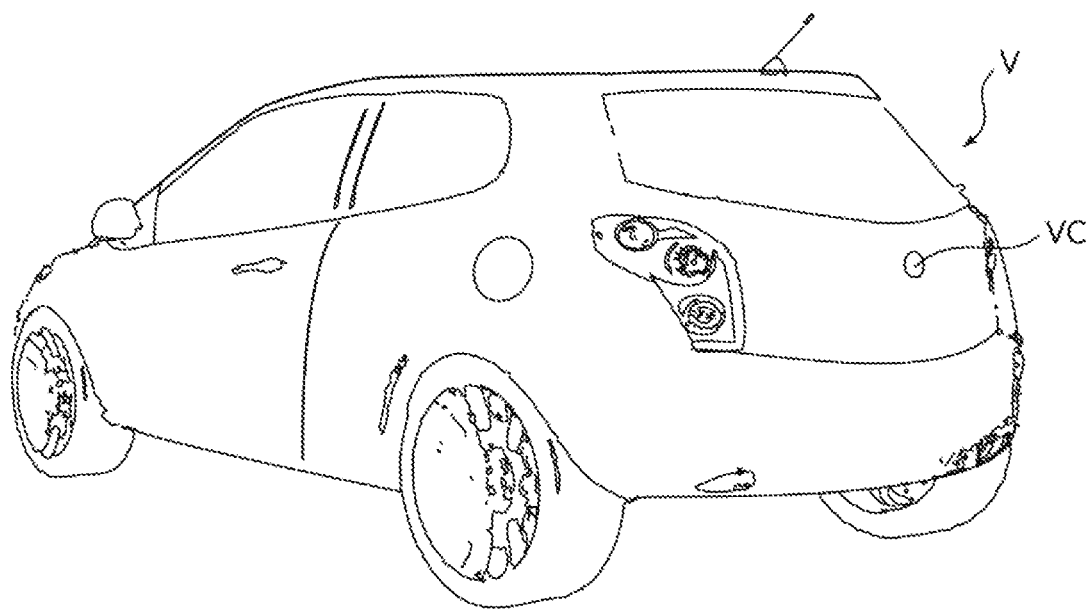

FIGS. 21A and 21B illustrate automobile V serving as the camera-mounted device in which in-vehicle camera module VC (Vehicle Camera) is mounted. FIG. 21A is a front view of automobile V and FIG. 21B is a rear perspective view of automobile V. In automobile V, camera module A described in the embodiments is mounted as in-vehicle camera module VC. As illustrated in FIGS. 21A and 21B, in-vehicle camera module VC may, for example, be attached to the windshield so as to face forward, or to the rear gate so as to face backward. Onboard camera module VC is used for rear monitoring, drive recording, collision avoidance control, automatic drive control, and the like.

The embodiments disclosed herein are merely an exemplification in every respect and should not be considered as limitative. The scope of the present invention is specified by the claims, not by the above-mentioned description. The scope of the present invention is intended to include all modifications in so far as they are within the scope of the appended claims or the equivalents thereof.

REFERENCE SIGNS LIST

1 Lens Driving Device
2 Cover
10 OIS Movable Part (AF Driving Part)
11 AF Movable Part
12 AF Fixing Part
13 Upper Elastic Supporting Part (AF Supporting Part)
14 Lower Elastic Supporting Part
15 Position-Detecting Magnet
16 AF Control Part
20 OIS Fixing Part
21 Base
22 Coil Board
30 OIS Supporting Part
31A, 31B Signal Suspension Wire
32A, 32B Power-Supplying Suspension Wire
111 Lens Holder
112 AF Coil Part
121 Magnet Holder
122 Magnet Part (AF Magnet Part, OIS Magnet Part)
122A to 122D Permanent Magnets
131, 132 Upper Plate Spring (AF Signal Line)
141, 142 Lower Plate Spring (Coil Power-Supply Line)
161 Control IC
162a, 162b Power-Supply Output Terminal
162c, 162d Power-Supply Input Terminal
162e, 162f Signal Input Terminal
163 Bypass Capacitor
164a to 164f Interconnection
165 Hall Element
166 AF Printed Wiring Board
171, 172 AF Power-Supply Line
221 OIS Coil Part
M Smartphone
A Camera Module

The invention claimed is:
1. A lens driving device, comprising:
an auto-focusing driving part including:
an auto-focusing coil part to be disposed at a periphery of a lens part;
an auto-focusing magnet part to be disposed to be radially spaced apart from the auto-focusing coil part; and
an auto-focusing supporting part configured to support an autofocus movable part to be movable in an optical-axis direction with respect to an autofocus fixing part, the autofocus movable part including the auto-focusing coil part, the autofocus fixing part including the auto-focusing magnet part, and the auto-focusing driving part being configured to perform automatic focusing by utilizing a driving force of a voice coil motor composed of the auto-focusing coil part and the auto-focusing magnet part; and
a shake-correcting driving part including:
a shake-correcting magnet part to be disposed in the autofocus fixing part;

a shake-correcting coil part to be disposed to be spaced apart from the shake-correcting magnet part in the optical-axis direction; and a shake-correcting supporting part configured to support a shake-correcting movable part to be able to sway in an optical-axis-orthogonal plane with respect to a shake-correcting fixing part, the shake-correcting movable part including the shake-correcting magnet part and the auto-focusing driving part, the shake-correcting fixing part including the shake-correcting coil part, and the shake-correcting driving part being configured to perform shake correction by utilizing a driving force of an another voice coil motor composed of the shake-correcting coil part and the shake-correcting magnet part, wherein:

the shake-correcting fixing part includes:

a coil board consisting of a multilayer printed wiring board in which a plurality of unit layers consisting of a conductor layer and an insulating layer are stacked on one another, and a base on which the coil board is to be placed, and the shake-correcting coil part, an external terminal, and a conductor pattern including a power-supply line configured to connect the external terminal to the shake-correcting coil part are integrally formed in the coil board.

2. The lens driving device according to claim 1, wherein: the coil board includes:

a main board portion to which the shake-correcting coil part is disposed, a terminal portion to which the external terminal is disposed, and a coupling portion configured to couple the main board portion and the external terminal together, the coupling portion is rounded, and the terminal portion extends substantially perpendicular to the main board portion.

3. The lens driving device according to claim 2, wherein the number of stacked layers of a first stack structure forming the main board portion is greater than that of a second stack structure forming the terminal portion, and the number of stacked layers of the second stack structure is greater than that of a third stack structure forming the coupling portion.

4. The lens driving device according to claim 2, wherein: the main board portion includes a resist layer covering a surface of the main board portion on a light reception side in the optical-axis direction, and the conductor layer or the insulating layer is exposed from the resist layer at a portion of the main board portion coming into contact with the autofocus movable part.

5. The lens driving device according to claim 2, wherein: the base includes a protruding portion protruding radially outward, and the coupling portion includes an opening with which the protruding portion is engaged.

6. The lens driving device according to claim 2, wherein: the conductor layer is formed from a copper foil, and the insulating layer is formed from a liquid crystal polymer.

7. The lens driving device according to claim 2, wherein the coil board and the base are adhered to each other with an elastic epoxy resin material.

8. The lens driving device according to claim 7, wherein: the main board portion includes a resist layer covering a surface of the main board portion on an image formation side in the optical-axis direction, and the conductor layer is exposed from a part of the resist layer.

9. The lens driving device according to claim 7, wherein the main board portion includes a magnetic plating layer covering the surface of the main board portion on the image formation side in the optical-axis direction.

10. The lens driving device according to claim 1, wherein: the base includes a terminal metal fixture to be electrically connected to the conductor pattern and to the shake-correcting supporting part, and electricity is supplied from the external terminal to the auto-focusing coil part via the conductor pattern, the terminal metal fixture, and the shake-correcting supporting part.

11. The lens driving device according to claim 10, wherein the terminal metal fixture is formed integrally with the base by insert molding.

12. The lens driving device according to claim 11, wherein:

the shake-correcting supporting part is a suspension wire, and a portion of the terminal metal fixture to be connected to the suspension wire is exposed from a rim portion of the base, and is arranged on the image formation side in the optical-axis direction relative to a surface of the base on the light reception side in the optical-axis direction.

13. The lens driving device according to claim 11, wherein a portion of the terminal metal fixture is exposed from the surface of the base on the image formation side in the optical-axis direction.

14. A camera module, comprising:

the lens driving device according to claim 1;

a lens part to be mounted on the autofocus movable part; and an image capturing part configured to capture a subject image imaged by the lens part.

15. A camera-mounted device that is an information device or a transporting device, the camera-mounted device comprising:

the camera module according to claim 14; and a control part configured to process image information obtained by the camera module.

* * * * *